(12) United States Patent
Hatano et al.

(10) Patent No.: US 7,667,332 B2
(45) Date of Patent: Feb. 23, 2010

(54) METHOD FOR GENERATING PATTERN, METHOD FOR MANUFACTURING SEMICONDUCTOR DEVICE, SEMICONDUCTOR DEVICE, AND COMPUTER PROGRAM PRODUCT

(75) Inventors: Masaaki Hatano, Yokohama (JP); Motoya Okazaki, San Jose, CA (US); Junichi Wada, Yokohama (JP); Takeshi Nishioka, Yokohama (JP); Hisashi Kaneko, Fujisawa (JP); Takeshi Fujimaki, Yokohama (JP); Kazuyuki Higashi, Yokohama (JP); Kenji Yoshida, Yokohama (JP); Noriaki Matsunaga, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 418 days.

(21) Appl. No.: 11/265,231

(22) Filed: Nov. 3, 2005

(65) Prior Publication Data

US 2006/0097399 A1     May 11, 2006

(30) Foreign Application Priority Data

Nov. 5, 2004   (JP)   ............. P2004-322170

(51) Int. Cl.
*H01L 23/52* (2006.01)
*H01L 23/48* (2006.01)
*H01L 29/40* (2006.01)

(52) U.S. Cl. ............. 257/774; 257/E23.145; 257/758; 257/773; 257/776; 438/129; 438/622

(58) Field of Classification Search .......... 257/E23.194, 257/E23.151, 773, 774, 758, 776, 288, E23.145, 257/750, 784, 786; 438/622, 129, 197, 612
See application file for complete search history.

(56) References Cited

U.S. PATENT DOCUMENTS

| 5,948,573 | A | 9/1999 | Takahashi |
| 6,225,697 | B1 * | 5/2001 | Iguchi ................. 257/758 |
| 6,253,362 | B1 | 6/2001 | Anand et al. |

(Continued)

FOREIGN PATENT DOCUMENTS

JP    63-025952    2/1988

(Continued)

OTHER PUBLICATIONS

M. Okazaki, et al., "Sea of Kelvin Multiple-pattern arrangement interconnect characterization for Low-k/Cu dual damascene and its findings", IITC 2004, Proceedings, pp. 211-213.

(Continued)

*Primary Examiner*—Chris C Chu
(74) *Attorney, Agent, or Firm*—Finnegan, Henderson, Farabow, Garrett & Dunner, L.L.P.

(57) ABSTRACT

A method for generating a pattern includes reading out an interconnect layout and a hole layout, the interconnect layout prescribing interconnect patterns, the hole layout prescribing hole patterns configured to connect to the interconnect patterns; extracting one of the hole patterns to be connected within the same interconnect layer level to one of the interconnect patterns in a pattern processing area; extracting a first processing area including the extracted hole pattern; calculating a first pattern density of the interconnect patterns included in the first processing area; and generating first additional patterns in the first processing area based on the first pattern density.

10 Claims, 21 Drawing Sheets

U.S. PATENT DOCUMENTS 6,261,883 B1 * 7/2001 Koubuchi et al. ............ 438/197
2001/0042921 A1 * 11/2001 Mori et al. .................. 257/758
2002/0061608 A1 * 5/2002 Kuroda et al. ............... 438/129

FOREIGN PATENT DOCUMENTS

| | | |
|---|---|---|
| JP | 04-218918 | 8/1992 |
| JP | 09-321044 | 12/1997 |
| JP | 11-297817 | 10/1999 |
| JP | 2002-134618 | 5/2002 |
| JP | 2004-88102 | 3/2004 |
| WO | WO 01/63673 | 8/2001 |

OTHER PUBLICATIONS

Notification of Reasons for Refusal mailed by the Japanese Patent Office on Jul. 14, 2009, for Japanese Application No. P2005-321571.

* cited by examiner

METHOD FOR GENERATING PATTERN, METHOD FOR MANUFACTURING SEMICONDUCTOR DEVICE, SEMICONDUCTOR DEVICE, AND COMPUTER PROGRAM PRODUCT

CROSS REFERENCE TO RELATED APPLICATIONS AND INCORPORATION BY REFERENCE

This application is based upon and claims the benefit of priority from prior Japanese Patent Application P2004-322170 filed on Nov. 5, 2004; the entire contents of which are incorporated by reference herein.

BACKGROUND OF THE INVENTION

1. Field of the Invention

The present invention relates to a method for generating a pattern of a photomask used for manufacturing a semiconductor device, a method for manufacturing a semiconductor device, a semiconductor device, and a computer program product for carrying out pattern generation.

2. Description of the Related Art

Along with an increase in speed of semiconductor devices such as large-scale integrated circuits (LSIs), downsizing and higher integration of elements, such as transistors, used in semiconductor devices, are now in progress. In such a semiconductor device, elements and multilevel interconnects are connected to one another by use of conductive via holes, contacts, and the like buried in interlevel dielectric films provided on a wafer. For downsizing and higher integration of semiconductor devices, widths and pitches of interconnects are reduced and an interconnect density in a multilevel interconnect layer is increased. As a result, both interconnect capacitances between interconnects in the same interconnect layer level and between different inter connect layers are increased. Propagation delays in the interconnects due to the increase of the interconnect capacitances inhibit or hinder an increase in speed of a semiconductor device.

In the same interconnect layer, a distribution problem in the interconnect density arises when other interconnects are disposed in the vicinity of the interconnects, which are connected to conductive via plugs and contacts for connection to other interconnect layer. There is a technique to equalize the interconnect density and to reduce the interconnect capacitance by providing a "c-shaped" interconnect portion for increasing the space between an interconnect connected to a conductive via plug or a contact and other interconnect. The spacing is increased more than a distance between the conductive via plug or the contact and the other interconnect (see International Publication WO 01/63673). In addition, a low dielectric constant (low-k) insulating film is used as an interlevel dielectric film to reduce the interconnect capacitance between the different interconnect layers.

For example, in computer-aided design (CAD), pattern processing for generating dummy patterns is executed on a layout of interconnect patterns disposed in a pattern processing area, so that pattern density may exceed a desired reference value. However, the dummy patterns may not be generated when the pattern density in the entire pattern processing area exceeds the reference value. Additionally, when many dense patterns are included in the pattern processing area, even if the pattern density is less than the reference value, it is not possible to increase sufficiently the pattern density in the processing area around an isolated pattern in relation to the reference value by using the dummy patterns generated in the pattern processing area. As a result, although a pattern density in the entire pattern processing area exceeds a desired value, a pattern density around an isolated pattern in the processing area may be less than the reference value. As described above, in the pattern processing area including the isolated pattern and the dense patterns, it is difficult to generate additional patterns, such as dummy patterns, so as to increase the pattern density in the processing area around the isolated pattern.

SUMMARY OF THE INVENTION

A first aspect of the present invention inheres in a method for generating a pattern including reading out an interconnect layout and a hole layout, the interconnect layout prescribing a plurality of interconnect patterns, the hole layout prescribing a plurality of hole patterns configured to connect to the interconnect patterns; extracting one of the hole patterns to be connected within the same interconnect layer level to one of the interconnect patterns in a pattern processing area; extracting a first processing area including the extracted hole pattern; calculating a first pattern density of the interconnect patterns included in the first processing area; and generating first additional patterns in the first processing area based on the first pattern density.

A second aspect of the present invention inheres in a method for manufacturing a semiconductor device including preparing interconnect layout data by processing including: extracting one of a plurality of hole patterns to be connected within the same interconnect layer level, to one of a plurality of interconnect patterns in a pattern processing area; extracting a first processing area including the extracted hole pattern; calculating a first pattern density of the interconnect patterns included in the first processing area; generating first additional patterns in the first processing area based on the first pattern density; providing the first additional patterns in the interconnect patterns; and fabricating a photomask for delineating the interconnect patterns so as to manufacture the semiconductor device based on the interconnect layout data.

A third aspect of the present invention inheres in a semiconductor device including an interconnect provided in an interconnect area on a surface of an insulating film; first dummy interconnects provided in a first area within the interconnect area, the first dummy interconnects having a first pitch, a first size, and a first local pattern density, which is defined as a pattern density of the first dummy interconnects within the first pitch; and second dummy interconnects provided in a second area excluding the first area within the interconnect area, the second dummy interconnects having a second pitch, a second size, and a second local pattern density, which is defined as a pattern density of the second dummy interconnect within the second pitch, at least one of the second pitch, the second size, and the second local pattern density being different from the first pitch, the first size, and the first local pattern density.

A fourth aspect of the present invention inheres in a computer program product configured to be executed by a computer including an instruction to read out an interconnect layout and a hole layout, the interconnect layout prescribing a plurality of interconnect patterns, the hole layout prescribing a plurality of hole patterns configured to connect to the interconnect patterns; an instruction to extract one of the hole patterns to be connected within the same interconnect layer level, to one of the interconnect patterns in a pattern processing area; an instruction to extract a first processing area including the extracted hole pattern; an instruction to calculate a first pattern density of the interconnect patterns included in the first processing area; and an instruction to generate first additional patterns in the first processing area based on the first pattern density.

DETAILED DESCRIPTION OF THE INVENTION

Figure 1:
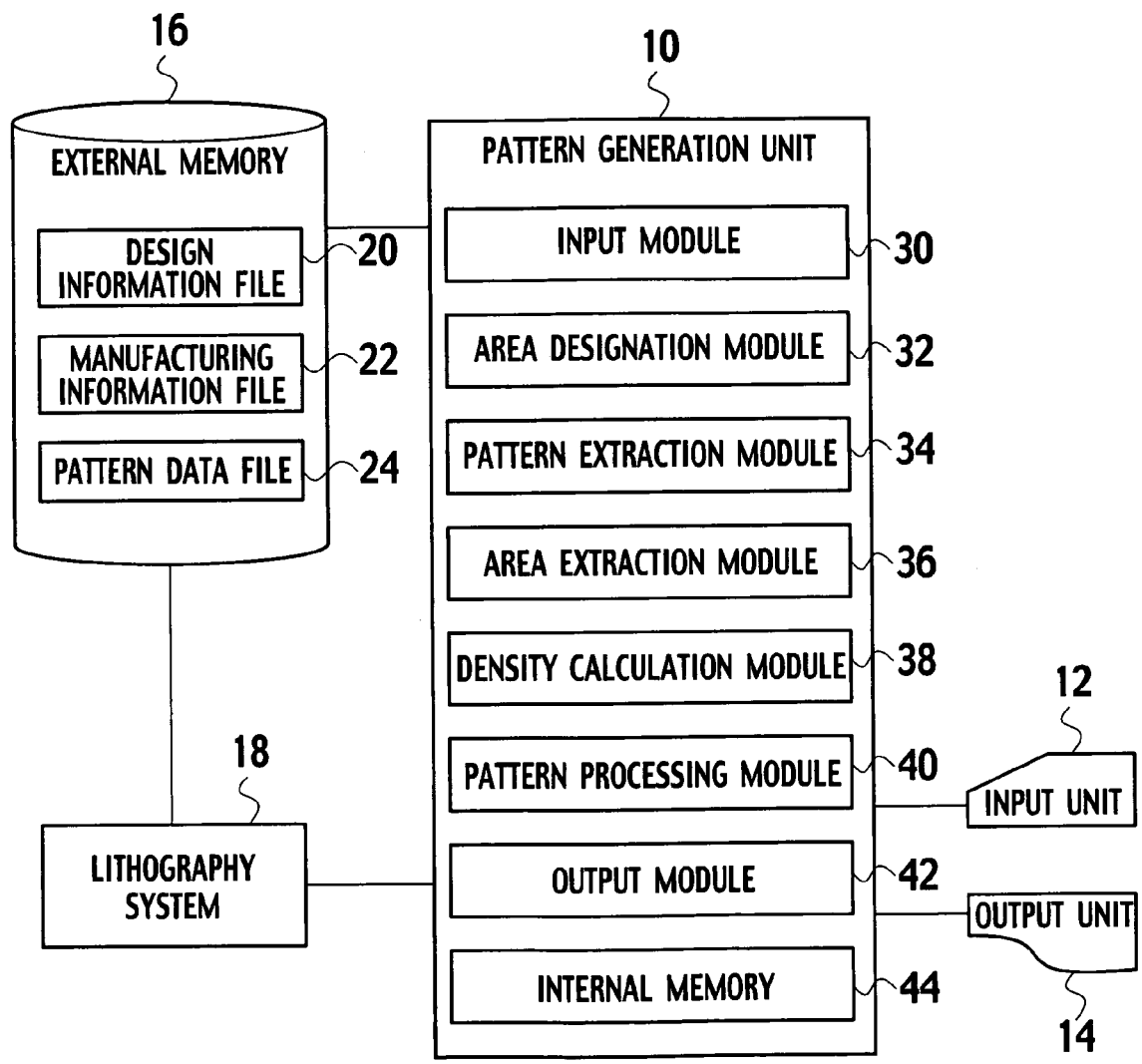
FIG. 1 is a schematic view showing an example of a system for generating a pattern according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

As shown in FIG. 1, a system for generating a pattern according to an embodiment of the present invention includes a pattern generation unit 10, an input unit 12, an output unit 14, an external memory 16, a lithography system 18, and the like. Additionally, the pattern generation unit 10 includes an input module 30, an area designation module 32, a pattern extraction module 34, an area extraction module 36, a density calculation module 38, a pattern processing module 40, an output module 42, an internal memory 44, and the like.

The pattern generation unit 10 reads out interconnect layout data for defining an interconnect pattern and hole layout data for defining a hole pattern connectable to an interconnect pattern from a design information storage file. A hole pattern to be connected to an interconnect pattern in a pattern processing area within the same interconnect layer level is extracted, and a first processing area surrounding the hole pattern is extracted. A pattern density of the interconnect pattern included in the first processing area is calculated, and additional patterns are generated based on the pattern density of the first processing area.

The pattern generation unit 10 may be part of a central processing unit (CPU) of a general purpose computer system. The input module 30, the area designation module 32, the pattern extraction module 34, the area extraction module 36, the density calculation module 38, the pattern processing module 40, and the output module 42 may be discrete hardware, or may be provided by virtually equivalent functions achieved by software, using the CPU of the general purpose computer system.

The external memory 16 connected to the pattern generation unit 10 includes a design information file 20, a manufacturing information file 22, a pattern data file 24, and the like. The design information file 20 stores design information of photomasks, which includes circuit specifications, circuit layouts, and the like, of a semiconductor device. The manufacturing information file 22 stores manufacturing specifications, manufacturing conditions, and the like, of the semiconductor device. The pattern data file 24 stores pattern data of mask patterns used for fabricating the photomasks. Moreover, the external memory 16 stores program instructions for respective processes executed by the pattern generation unit 10. The program instruction is read by the pattern generation unit 10 when necessary, and computation is executed accordingly. The external memory 16 may be constructed by use of an auxiliary storage device including a semiconductor memory device, such as a semiconductor read-only memory (ROM) and a semiconductor random access memory (RAM), a magnetic disk device, a magnetic drum device, a magnetic tape device, and the like. Alternatively, it is also possible to construct the external memory 16 by use of a main memory of the CPU of the computer.

The lithography system 18 includes a lithography control unit, a lithography apparatus, and the like, which are not shown in the drawing. The lithography control unit acquires the pattern data of the mask patterns either from the pattern data file 24 or from the pattern generation unit 10. The lithography apparatus executes fabrication of the photomasks by use of the pattern data acquired by the lithography control unit.

Figure 2:
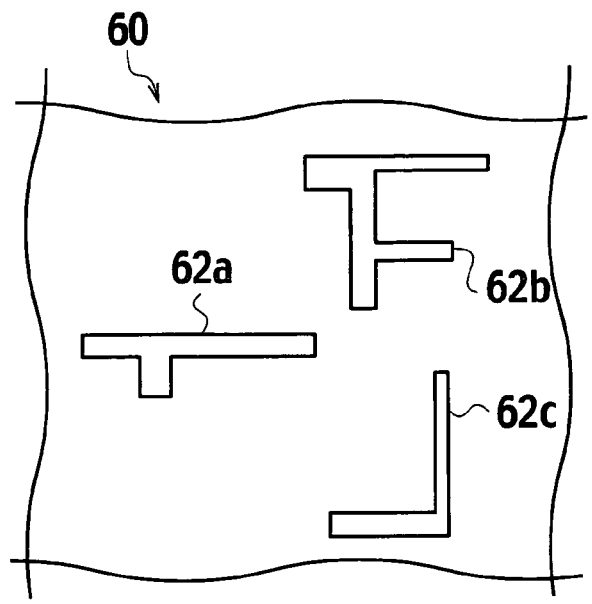
FIG. 2 is a view showing an example of an interconnect layout used for explaining the embodiment of the present invention.
Figure 3:
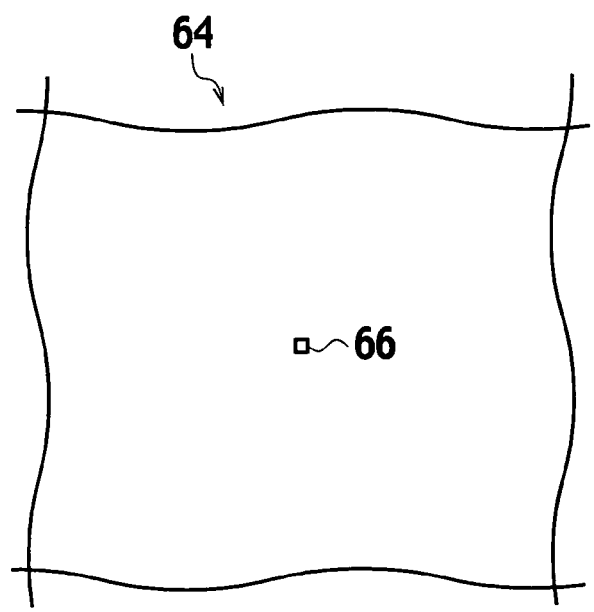
FIG. 3 is a view showing an example of a hole layout used for explaining the embodiment of the present invention.

The input module 30 of the pattern generation unit 10 reads out and acquires or selects the layouts of the interconnect patterns and the hole pattern stored in the design information file 20. For example, an interconnect layout 60 including interconnect patterns 62*a*, 62*b*, and 62*c*, as shown in FIG. 2, is acquired or selected from the design information file 20. A hole layout 64 including a hole pattern 66, as shown in FIG. 3, is acquired or selected from the design information file 20. Here, the interconnect pattern 62*a* is an isolated pattern where a pattern density of a surrounding area is less than about 20%. Dense patterns are disposed in an unillustrated area.

Figure 4:
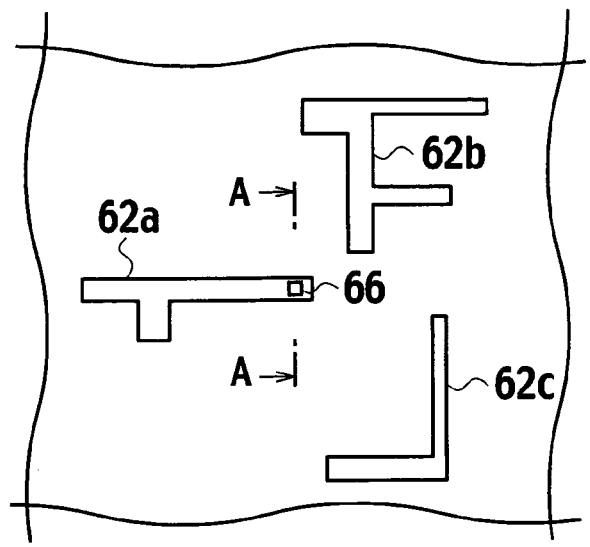
FIG. 4 is an overlay view showing an example of the interconnect and hole layouts used for explaining the embodiment of the present invention.
Figure 5:
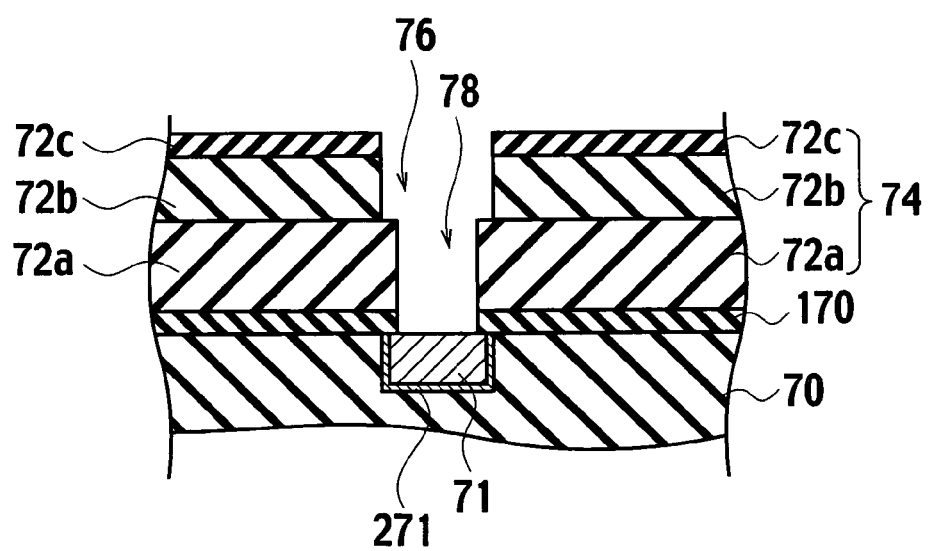
FIG. 5 is a cross sectional view showing an example of an interconnect layer corresponding to the V-V line in FIG. 4

The interconnect layout 60 and the hole layout 64 shown in FIGS. 2, 3, which prescribe the interconnect patterns 62*a*, 62*b*, and 62*c*, and the hole pattern 66 in the same interconnect layer level, are disposed such that the hole pattern 66 overlaps one end portion of the interconnect pattern 62*a*, as shown in FIG. 4. For example, grooves for a dual damascene structure are processed by use of photomasks fabricated based on the interconnect layout 60 and the hole layout 64. As shown in FIG. 5, a barrier layer 271 and a conductive film 71 are formed in a first interlevel dielectric film 70 as an underlying interconnect. A diffusion barrier film 170 is formed on the underlying interconnect and on the first interlevel dielectric film 70. A hole layer insulating film 72*a*, an interconnect layer insulating film 72*b*, and a cap insulating film 72*c* are deposited on a surface of the diffusion barrier film 170, to form a second interlevel dielectric film 74. An interconnect groove 76 and a via hole 78, which correspond to the interconnect pattern 62*a* and the hole pattern 66, are respectively formed on the interconnect layer insulating film 72*b* and on the hole layer insulating film 72*a*. An interconnect layer of the dual damascene structure is formed by filling a metal into the interconnect groove 76 and the via hole 78.

Figure 6:
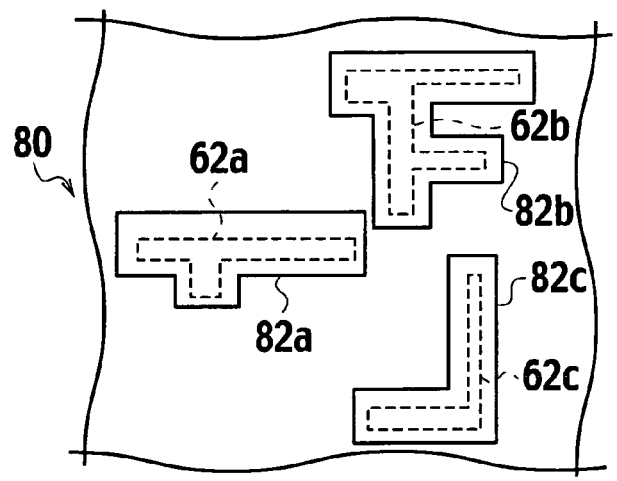
FIG. 6 is a view showing an example of a restricted area according to the embodiment of the present invention.

The area designation module 32 arranges the interconnect patterns 62*a*, 62*b*, and 62*c* in a pattern processing area 80, as shown in FIG. 6. Then, for the interconnect patterns 62*a*, 62*b*, and 62*c*, the area designation module 32 designates restricted areas 82*a*, 82*b*, and 82*c* respectively around the interconnect patterns 62*a*, 62*b*, and 62*c* based on a predetermined design rule. Here, the "restricted area" is an area where generation of a new pattern is restricted based on a design rule. The design rule is provided by reduction of capacitances between the interconnects and the interconnect layers, limitation of pattern proximity and pattern overlap by optical proximity correction (OPC), restriction attributable to pattern layouts of pads and power lines in upper and lower interconnect layers, and the like. In the embodiment of the present invention, an area on a plane of the interconnect layout 60 or the hole layout 64 divided into a square of about 200 μm on a side, is used as the pattern processing area 80.

Figure 7:
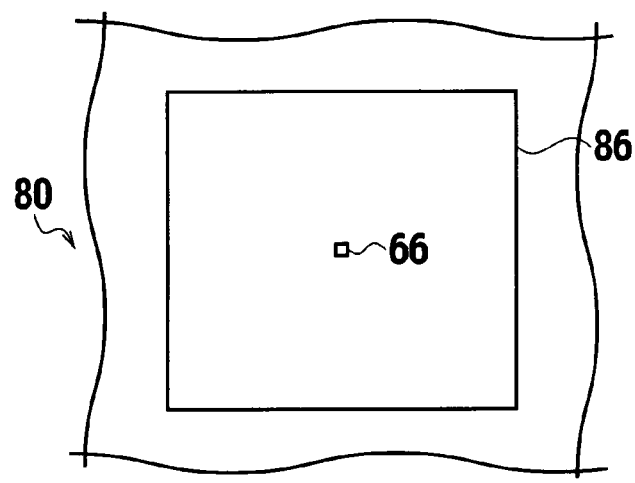
FIG. 7 is a view showing an example of a first processing area according to the embodiment of the present invention.

The pattern extraction module 34 arranges the hole layout 64 in the pattern processing area 80, as shown in FIG. 7. For example, the hole pattern 66 overlapping the interconnect pattern 62*a* is extracted from the hole layout 64. Here, illustration of the interconnect patters 62*a*, 62*b*, and 62*c*, and the restricted areas 82*a*, 82*b*, and 82*c* is omitted in FIG. 7 for convenience and clarity.

Figure 8:
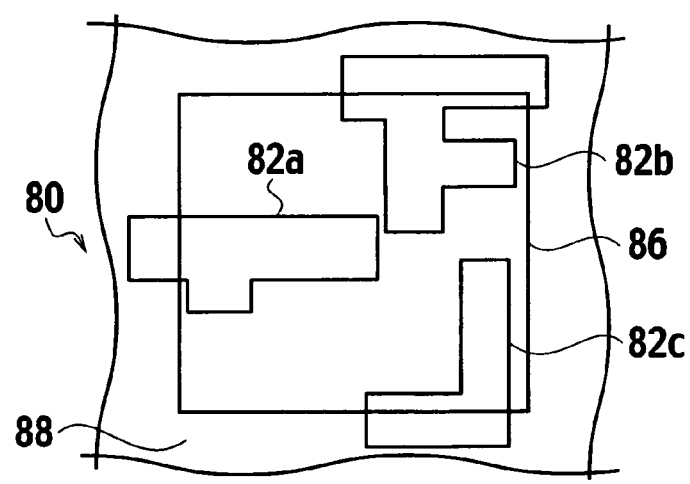
FIG. 8 is a view showing an example of a second processing area according to the embodiment of the present invention.

The area extraction module 36 extracts a first processing area 86 in a peripheral area surrounding the hole pattern 66 as shown in FIG. 7. Additionally, as shown in FIG. 8, the area extraction module 36 extracts a second processing area 88 excluding the restricted areas 82*a*, 82*b*, 82*c*, and the first processing area 86. For example, a square of about 20 μm on a side is used as the first processing area 86 in the embodiment of the present invention.

The density calculation module 38 calculates a pattern density of the interconnect patterns, respectively, in the first and second processing areas 86 and 88. Here, the pattern density is a proportion of the area of the interconnect patterns arranged in the processing area relative to the area of the processing area.

Figure 9:
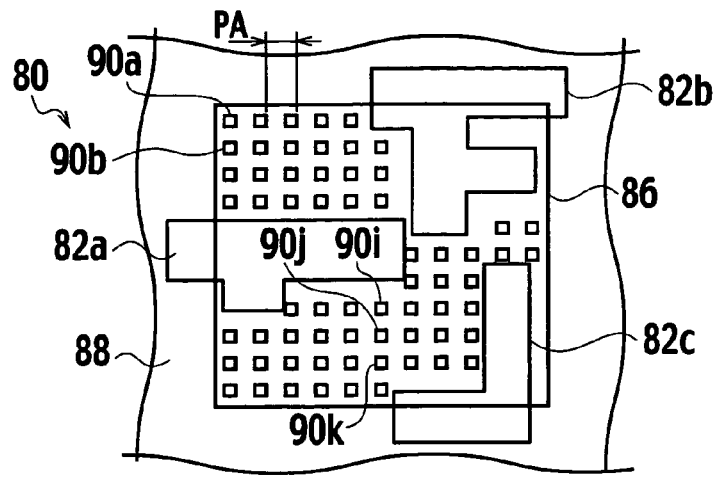
FIG. 9 is a view showing an example of dummy patterns generated in the first processing area according to the embodiment of the present invention.
Figure 10:
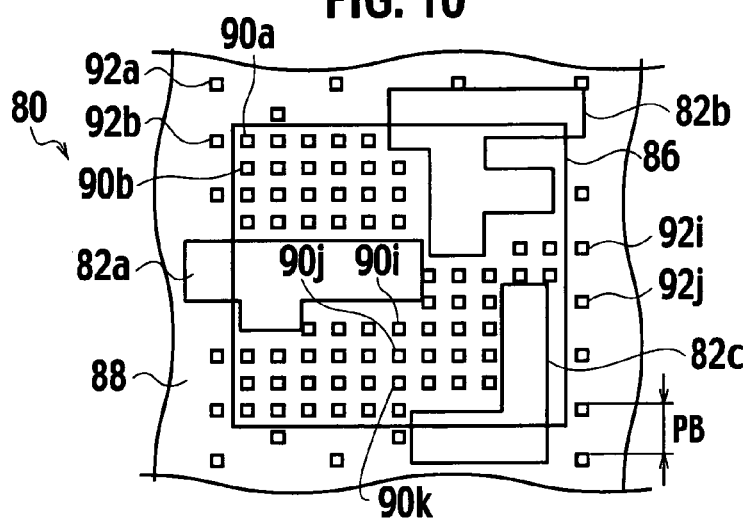
FIG. 10 is a view showing an example of dummy patterns generated in the second processing are a according to the embodiment of the present invention.
Figure 11:
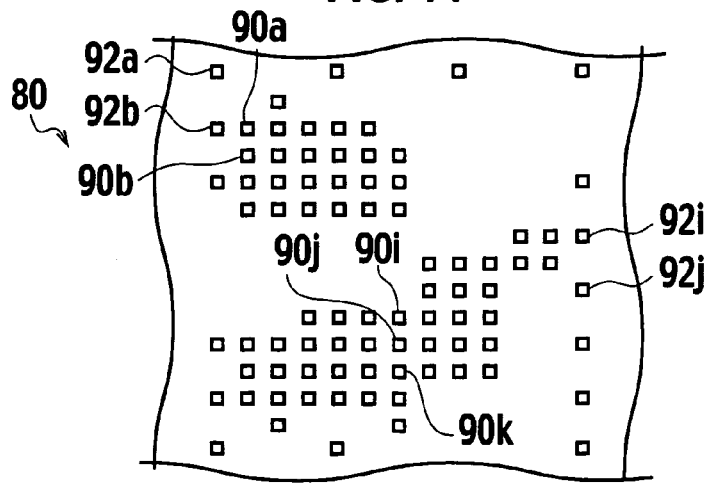
FIG. 11 is a view showing an example of the dummy patterns arranged in the pattern processing area according to the embodiment of the present invention.

The pattern processing module 40 generates additional patterns in the first and second processing areas 86 and 88 based on the calculated pattern density of the first and second processing areas 86 and 88. To be more precise, reference values for the pattern density are predetermined for the first and second processing areas 86 and 88, respectively. In the embodiment of the present invention, the reference values for the pattern density for the first and second processing areas 86 and 88 are determined to be 20% in common, for example. As shown in FIG. 9, dummy patterns 90*a*, 90*b*, . . . , 90*i*, 90*j*, 90*k*, . . . arranged with a first pitch PA are generated in the first processing area 86 as first additional patterns so that the pattern density calculated in the first processing area 86 exceeds the reference value. Moreover, as shown in FIG. 10, dummy patterns 92*a*, 92*b*, . . . , 92*i*, 92*j*, . . . arranged with a second pitch PB are generated in the second processing area 88 as second additional patterns so that the pattern density calculated in the second processing area 88 exceeds the reference value. As a result, as shown in FIG. 11, the dummy patterns 90*a* to 90*k*, . . . , and 92*a* to 92*j*, . . . , are generated in the pattern processing area 80. The interconnect pattern 62*a* included in the first processing area 86 is the isolated pattern, and the dense patterns are included in the second processing area 88. Additionally, the sizes of the dummy patterns 90*a* to 90k, . . . , and 92a to 92j, . . . are substantially equal. Therefore, the first pitch Pa of the dummy patterns 90a to 90k, . . . arranged in the first processing area 86 is smaller than the second pitch Pb of the dummy patterns 92a to 92j, . . . arranged in the second processing area 88.

Figure 12:
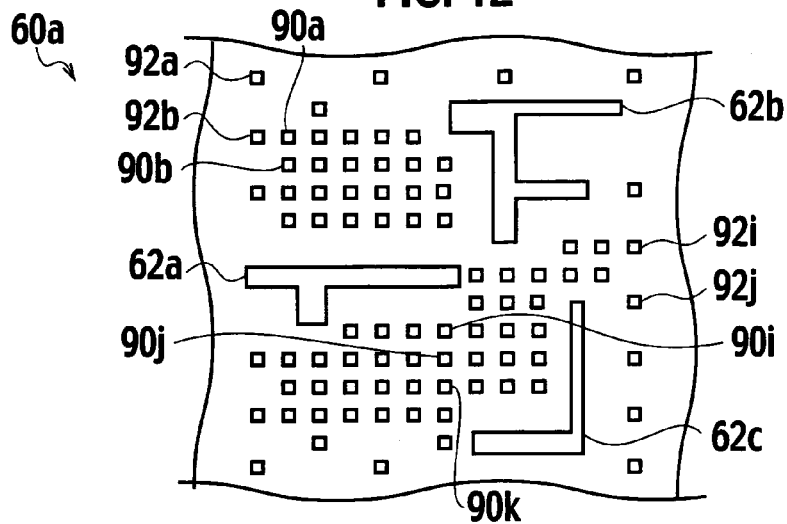
FIG. 12 is a view showing an example of the interconnect layout created by a method for generating a pattern according to the embodiment of the present invention.
Figure 13:
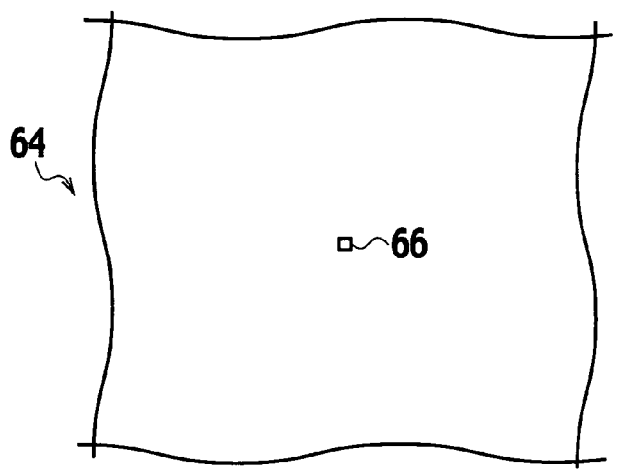
FIG. 13 is a view showing an example of the hole layout created by the method for generating a pattern according to the embodiment of the present invention.

Further, the pattern processing module 40 adds the generated dummy patterns 90a to 90k, . . . , and 92a to 92j, . . . to the interconnect layout 60. As a result, as shown in FIGS. 12 and 13, the hole layout 64 including the hole pattern 66a and an interconnect layout 60a including the dummy patterns 90a to 90k, . . . , and 92a to 92j, . . . added to the interconnect patterns 62a to 62c are respectively prepared.

The output module 42 stores the interconnect layout 60a and the hole layout 64 in the pattern data file 24 of the external memory 16 as the pattern data. Alternatively, the output module 42 may transmit the interconnect layout 60a and the hole layout 64 directly to the lithography system 18.

The internal memory 44 stores the layouts acquired by the input module 30, the pattern processing areas and the restricted areas, which are designated by the area designation module 32, the hole pattern extracted by the pattern extraction module 34, the first and second processing areas extracted by the area extraction module 36, the pattern density calculated by the density calculation module 38, the additional patterns and layouts prepared by the pattern processing module 40, and the like.

The input unit 12 refers to devices such as a keyboard and a mouse. When an input operation is performed from the input unit 12, corresponding key information is transmitted to the pattern generation unit 10. The output unit 14 refers to a screen monitor, such as a cathode-ray tube, a liquid crystal display (LCD), a light emitting diode (LED) panel, an electroluminescent (EL) panel and the like. The output unit 14 displays the pattern processing areas processed by the pattern generation unit 10 and the layouts and the like acquired by the same.

The external memory 16 stores programs which allow the pattern generation unit 10 to implement pattern extraction, area designation, area extraction, calculation of the pattern density, pattern generation, pattern processing, and the like, for the acquired layout. The internal memory 44 or the external memory 16 of the pattern generation unit 10 temporarily stores data obtained during a calculation and pattern processing thereof during the operation of the pattern generation unit 10.

As described above, in the system for generating a pattern according to the embodiment of the present invention, by extracting the hole pattern 66 overlapping the interconnect pattern 62a, the first processing area 86 is extracted in the peripheral area of the hole pattern 66, as shown in FIG. 7. The dummy patterns 90a to 90k, . . . are generated, as shown in FIG. 9, based on the pattern density of the interconnect patterns in the first processing area 86. Thus, it is possible to calculate the pattern density of the first processing area 86 without relying on the pattern density of the pattern processing area 80 including the first processing area 86. Therefore, it is possible to generate the additional patterns, such as the dummy patterns, so as to increase the pattern density in the processing area around the isolated pattern arranged in the pattern processing area including the dense patterns.

For example, dishing occurs on a surface of an interconnect portion in an insulator, which is planarized by chemical mechanical polishing (CMP), in accordance with a pattern density of interconnects and the like which are covered with an interlevel dielectric film. To ensure flatness of the planarized surface, it is desirable to add dummy patterns to a sparse interconnect area so that the pattern density is uniformly distributed. However, in order to reduce the interconnect capacities between the interconnects and between the interconnect layers, it is undesirable to add actually unnecessary dummy patterns. Due to such a tradeoff relation, the sparse interconnect area may remain, in which the desired pattern density is not ensured.

A low-k insulating film, such as a porous film, is used as the interlevel dielectric film to reduce a dielectric constant. The low-k insulating film has low mechanical strength. Accordingly, a dense cap insulating film, such as silicon dioxide ($SiO_2$) or silicon nitride ($Si_3N_4$), is formed on a surface of the low-k insulating film for protection against mechanical damages that may occur in a manufacturing process. The interlevel dielectric film, such as the low-k insulating film, is easily damaged by reactive ion etching (RIE) and the like, and tends to absorb water, residual gas components, and the like. Water and residual gas contained in the interlevel dielectric film do not substantially penetrate the cap insulating film, and are trapped in the interlevel dielectric film.

For example, in a deposition process to fill a metal into holes, such as via holes or contact holes in the interlevel dielectric film, and interconnect grooves, degasification is implemented prior to metal deposition. In an area of the interlevel dielectric film, in which dense interconnect patterns are transferred to provide a certain value of pattern density of interconnects and the like, degasification can be implemented through hole portions or interconnect groove portions where the cap insulating film is removed. However, in an area of an isolated interconnect pattern, the water, the residual gas components and the like contained in the interlevel dielectric film cannot sufficiently escape during degasification and may remain therein. In the sparse interconnect pattern area, during or after the deposition process of a barrier layer and a buried metal, the barrier layer is oxidized or modified by the water and the residual gas contained in the interlevel dielectric film. As a result, insufficient adhesion between the barrier layer and the buried metal in the holes, such as via plugs, contacts, and between the barrier layer and the interlevel dielectric film occurs, to induce stress-induced voiding (SIV). The SIV causes interconnect defects, such as high resistance and disconnection, between the interconnect layers.

Figure 14:
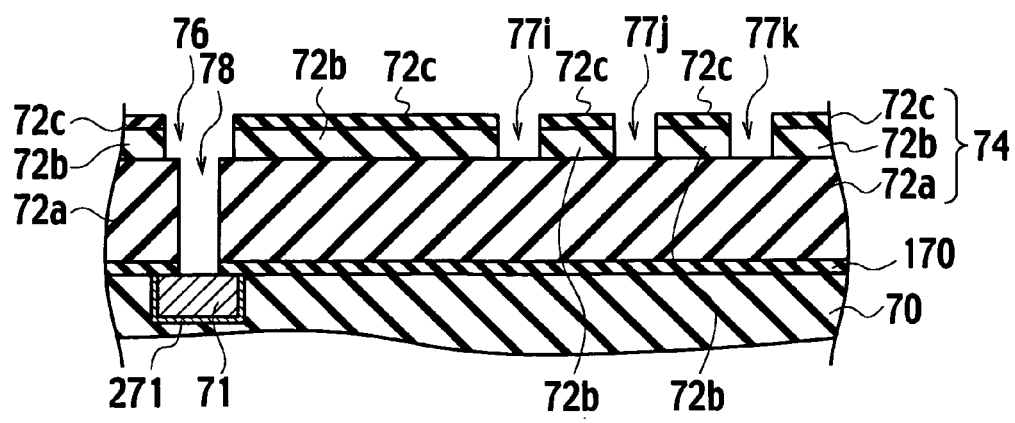
FIG. 14 is a cross sectional view showing an example of an interconnect layer manufactured based on the interconnect layout created by a method for generating a pattern according to the embodiment of the present invention.

In the embodiment of the present invention, the photomasks are fabricated based on the pattern data of the interconnect layout 60a and the hole layout 64, as shown in FIGS. 12 and 13, for example. When the interconnect groove 76 and the via hole 78 are formed by use of the fabricated photomasks, as shown in FIG. 14, dummy grooves 77i, 77j, and 77k corresponding to the dummy patterns 90i, 90j, and 90k are formed.

To reduce an interlayer capacitance, a porous low-k insulating film is used for. The material of the low-k insulating film used for the hole layer insulating film 72a and the interconnect layer insulating film 72b of the second interlevel dielectric film 74 may be an inorganic material, such as carbon-doped silicon oxide (SiOC) and inorganic spin-on-glass (SOG), an organic material, such as organic SOG, and the like. Alternatively, it is possible to use a laminated film of an inorganic material film, an organic material film, and the like, as the low-k insulating film. In order to reduce the capacitances between the interconnect layers and between the interconnects, it is particularly desirable to use a porous low-k insulating film as the interconnect layer insulating film 72b. An insulating film having low gas permeability, such as $SiO_2$ and $Si_3N_4$, is used as the cap insulating film 72c to protect the low-k insulating film which has low mechanical strength.

The hole layer insulating film 72a contains water and residual gas. Degasification of the hole layer insulating film 72a is implemented before a metal filling process to be subsequently implemented, for example. In the embodiment of the present invention, the interconnect layer insulating film 72b and the dummy grooves 77i, 77j, and 77k, where the cap insulating film 72c having the low gas permeability is removed, are formed around the interconnect groove 76 and the via hole 78. Accordingly, it is possible to degas the hole layer insulating film 72a efficiently.

In addition, in the embodiment of the present invention, the area on the plane of the interconnect layout 60 or the hole layout 64 divided into the square of about 200 μm on a side, is used as the pattern processing area 80. However, the pattern processing area 80 is not limited only to the square area of about 200 μm on a side. For example, it is also possible to define an area divided into a square of less than 200 μm on a side, as the pattern processing area. Alternatively, it is possible to define the undivided entire plane of the layout as the pattern processing area. In an actual operation, the pattern processing area may be defined appropriately in consideration of the increase in the processing time due to the increase in the amount of processing in the case of a small pattern processing area, and the degradation of accuracy of pattern processing in the case of a large pattern processing area.

The square area of about 20 μm on a side is extracted as the first processing area 86. However, the size of the first processing area 86 is not limited. The size of the first processing area may be determined based on film properties of the hole layer insulating film 72a shown in FIG. 14. When the low-k insulating film used for the hole layer insulating film 72a is a more porous material that may include a greater amount of water and residual gas components, it is desirable to reduce the first processing area as appropriate.

Moreover, the first processing area 86 is extracted so that the hole pattern 66 is located substantially in the center of the first processing area 86. This configuration is effective when the interconnect pattern 62a connected to the hole pattern 66 is an isolated pattern associated with the peripheral area having substantially uniform pattern density. However, it is also possible to extract the first processing area so as to locate the hole pattern 66 in an arbitrary position shifted from the center of the first processing area. For example, when the pattern density exhibits uneven distribution in the peripheral area of the interconnect pattern connected to the hole pattern, the first processing area may be extracted so as to provide the hole pattern 66 at an edge or a corner of the first processing area that has a low pattern density.

The first processing area 86 is included in the pattern processing area 80, as shown in FIG. 7. However, the extracted first processing area 86 is not limited only to an area within the pattern processing area 80. For example, when the extracted hole pattern 66 is located at an edge or a corner of the pattern processing area 80, the first processing area 86 may be extracted so as to protrude beyond a boundary of the pattern processing area 80.

The reference values of the pattern density for the first and second processing areas 86 and 88 are set to 20% in common. However, the reference values for the pattern density are note limited to 20%. Particularly, it is desirable to provide the reference value for the first processing area to be larger than the second processing area. That is, when the low-k insulating film used for the hole layer insulating film 72a is a more porous material that may include a larger amount of water and residual gas components, it is possible to efficiently perform degasification by increasing the reference value of the pattern density for the first processing area, as appropriate.

Figure 15:
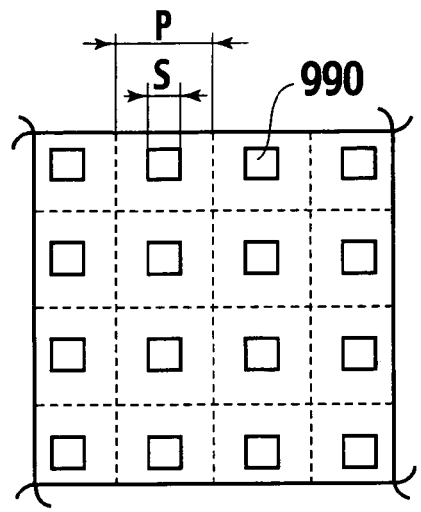
FIG. 15 is a view showing an example of dummy patterns used for explaining a local pattern density.

The additional patterns are generated with the same size in the first and second processing areas 86 and 88, as shown in FIG. 9 and FIG. 10. However, the sizes of the additional patterns may differ with the first and second processing areas 86 and 88. Sizes and pitches of the additional patterns may be determined for each processing area depending on the desired pattern density for each processing area. Particularly, it is desirable to generate the additional patterns in the first processing area 86 with smaller sizes and shorter pitches than the second processing area 88. If a local pattern density of the first additional patterns in the first processing area 86 is the same, the pitch of each first additional pattern is reduced by reducing the size of each first additional pattern therein. Here, the "local pattern density" is defined as a pattern density of the additional patterns in one pitch. For example, as shown in FIG. 15, a local pattern density of patterns 990 arranged with a pitch P and a size S along the orthogonal axis is denoted by $(S^2/P^2)$.

Figure 16:
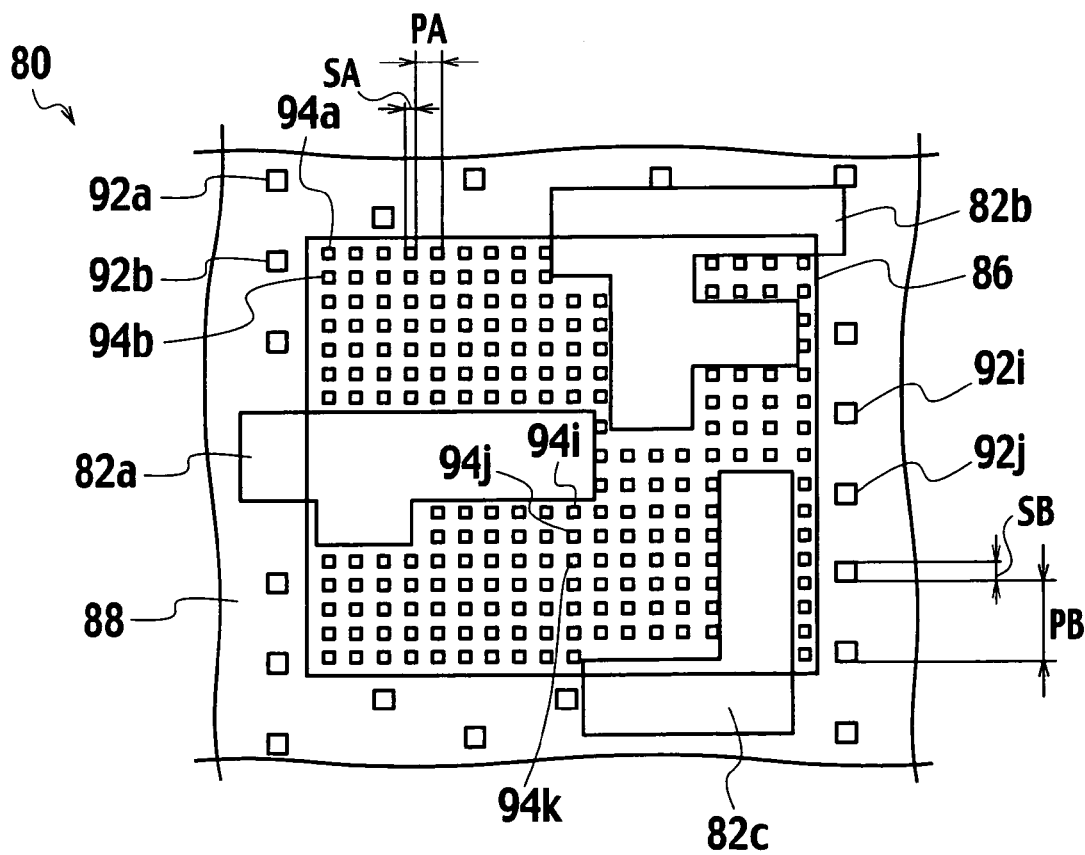
FIG. 16 is a view showing another example of the dummy patterns arranged in the first and second processing areas according to the embodiment of the present invention.

For example, as shown in FIG. 16, a first width SA of each of dummy patterns 94a, 94b, . . . , 94i, 94j, 94k, . . . , generated in the first processing area 86 is smaller than a second width SB of each of the dummy patterns 92a, 92b, . . . , 92i, 92j, . . . , generated in the second processing area 88. Moreover, a value of a first pitch PA of the dummy patterns 94a to 94k, . . . , is smaller than a second pitch PB of the dummy patterns 92a to 92j, . . . , and smaller than a value of the first pitch PA of the dummy patterns 90a to 90k, . . . . Therefore, it is possible to provide a uniform distribution of a first local pattern density of the dummy patterns 94a to 94k, . . . , around the restricted areas 82a, 82b, and 82c. Furthermore, in order to efficiently perform degasification of the hole layer insulating film 72a surrounding the hole pattern, it is desirable to make the first local pattern density greater than a second local pattern density of the dummy patterns 92a to 92j, . . . .

As shown in FIG. 11, the rectangular dummy patterns 90a to 90k, . . . , and 92a to 92j, . . . , are used as the additional patterns. However, the shape of the dummy patterns 90a to 90k, . . . , and 92a to 92j, . . . , is not limited. It is also possible to apply an arbitrary shape. Moreover, it is possible to add not only the dummy patterns but also interconnect patterns as the additional patterns.

Next, a method for generating a pattern according to the embodiment of the present invention will be described by use of a flowchart shown in FIG. 17. Here, circuit layouts of a semiconductor device are stored in the design information file 20 of the external memory 16.

In Step S100, the input module 30 of the pattern generation unit 10 shown in FIG. 1 reads out the interconnect layout 60 and the hole layout 64, respectively shown in FIGS. 2 and 3, from the design information file 20. The interconnect layout 60 prescribes the interconnect patterns 62a, 62b, and 62c. The hole layout 64 prescribes the hole pattern 66.

In Step S101, the area designation module 32 designates the pattern processing area 80 shown in FIG. 6 and arranges the interconnect patterns 62a, 62b, and 62c in the pattern processing area 80. Then, for the interconnect patterns 62a, 62b, and 62c, the restricted areas 82a, 82b, and 82c are designated, respectively, in the peripheries of the interconnect patterns 62a, 62b, and 62c, based on the predetermined design rule.

In Step S102, the pattern extraction module 34 extracts the hole pattern 66 that overlaps the interconnect pattern 62a from the hole layout 64 arranged in the pattern processing area 80.

In Step S104, the area extraction module 36 extracts the first processing area 86 shown in FIG. 7, in the peripheral area surrounding the hole pattern 66. Additionally, the area extraction module 36 extracts the second processing area 88 shown in FIG. 8, to exclude the restricted areas 82a, 82b, and 82c and the first processing area 86.

In Step S105, the density calculation module 38 calculates the pattern density of the interconnect patterns for the first and second processing areas 86 and 88, respectively.

In Step S106, the pattern processing module 40 generates the dummy patterns 90a to 90k, . . . , and 92a to 92j, . . . , as the first and second additional patterns in the first and second processing areas 86 and 88 based on the pattern density respectively calculated in the first and second processing areas 86 and 88. The dummy patterns 90a to 90k, . . . , and 92a to 92j, . . . , are added to the interconnect layout 60 shown in FIG. 2. Thus, the interconnect layout 60a shown in FIG. 12 is provided.

In Step S107, the output module 42 stores the interconnect layout 60a and the hole layout 64 in the pattern data file 24 of the external memory 16 as the pattern data.

In Step S108, the lithography system 18 fabricates the photomasks based on the pattern data of the interconnect layout 60a and the hole layout 64.

In Step S109, patterns of the photomasks are transferred by an exposure tool onto a resist film coated by a spin coater on the interlevel dielectric film on a semiconductor substrate. A manufacturing process of the interconnect layer of a semiconductor device is executed, by selective etching by an etching tool, using the transferred resist pattern as a mask to form the interconnect grooves on the interlevel dielectric film.

In the method for generating a pattern according to the embodiment of the present invention, it is possible to generate additional patterns, such as the dummy patterns, so as to increase the pattern density in the processing area around the isolated pattern.

Next, as the method for manufacturing a semiconductor device executed in Step S109, a manufacturing process of the interconnect layer will be described by use of cross-sectional views shown in FIGS. 18 to 22. Elements of a semiconductor device, such as transistors, are formed on an unillustrated semiconductor substrate. Multilevel interconnect layers are formed on the semiconductor substrate. Interconnects of the interconnect layers and plugs connected to bottom surfaces of the interconnects are formed by a dual damascene process. Although interconnect grooves are formed after forming a via hole in the following description, it is also possible to form the via hole after forming the interconnect grooves.

Figure 18:
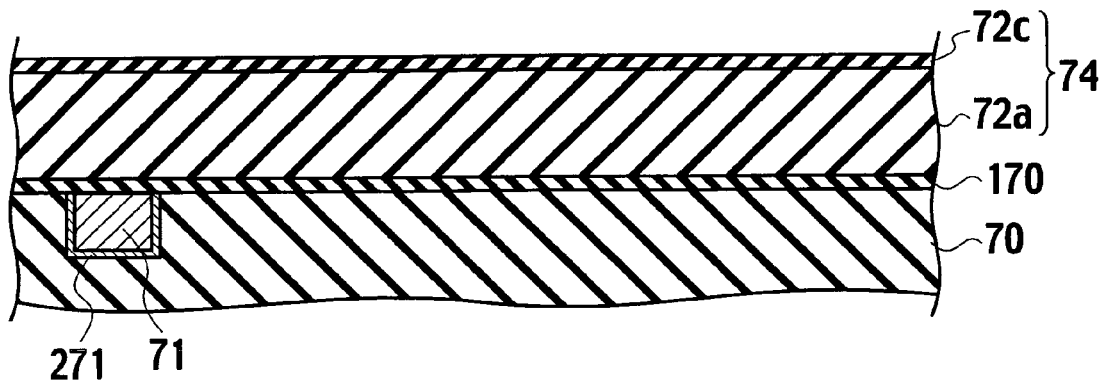
FIGS. 18 to 22 are cross section views showing an example of a method for manufacturing a semiconductor device according to the embodiment of the present invention.

As shown in FIG. 18, the diffusion barrier film 170 is deposited on the first interlevel dielectric film 70 which includes the barrier layer 271 and the conductive film 71 as the underlying interconnect of a target interconnect layer. The hole layer insulating film 72a, and the cap insulating film 72c are deposited on the diffusion barrier film 170 as the second interlevel dielectric film 74. For example, the barrier layer 271 is a refractory metal film, such as tantalum (Ta), niobium (Nb), titanium (Ti), tungsten (W), and vanadium (V), a nitride film of the refractory metal, a laminated film of the refractory metal and the nitride of the refractory metal, and the like. The conductive film 71 is a metal containing copper (Cu) as a main component, and the like. The first interlevel dielectric film 70 is a low-k insulating film, a SiO$_2$ film, a laminated film including the low-k insulating film and the SiO$_2$ film, and the like. The diffusion barrier film 170 is a Si$_3$N$_4$ film, silicon carbide (SiC) film, nitrogen-doped silicon carbide (SiCN) film, and the like. The hole layer insulating film 72a is a low-k insulating film, and the like. The cap insulating film 72c is a SiO$_2$ film, a Si$_3$N$_4$ film, and the like. In addition, the second interlevel dielectric film 74 is formed as the single low-k insulating film. An interconnect layer insulating film may be formed by using an insulating film which is different from the hole layer insulating film 72a as shown in FIGS. 5 and 14.

Figure 19:
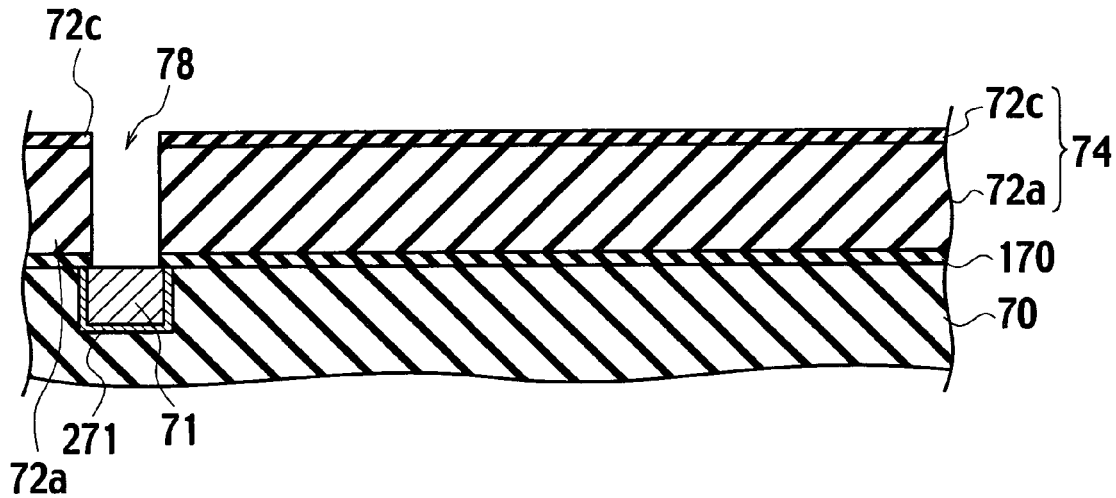

The second interlevel dielectric film 74 is selectively removed, by photolithography, RIE and the like, using the photomask on which the hole layout 64 shown in FIG. 13 is delineated. As shown in FIG. 19, the via hole 78 is formed so as to reveal a surface of the conductive film 71.

Figure 20:
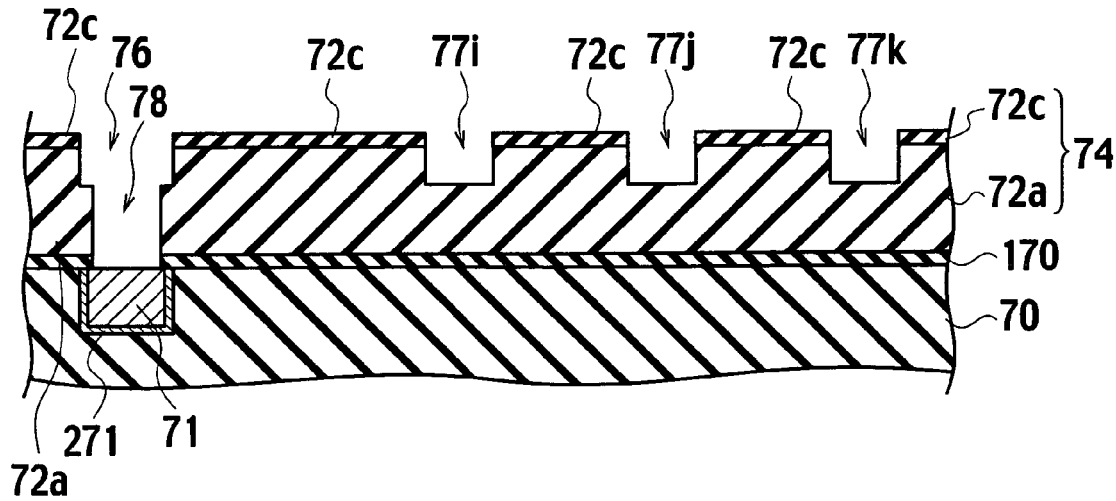

The second interlevel dielectric film 74 is selectively removed, by photolithography, RIE and the like, using the photomask on which the interconnect pattern layout 60a shown in FIG. 12 is delineated. As shown in FIG. 20, the interconnect groove 76 is formed on top of the via hole 78 and the dummy grooves 77i, 77j, and 77k are formed around the interconnect groove 76.

Figure 21:
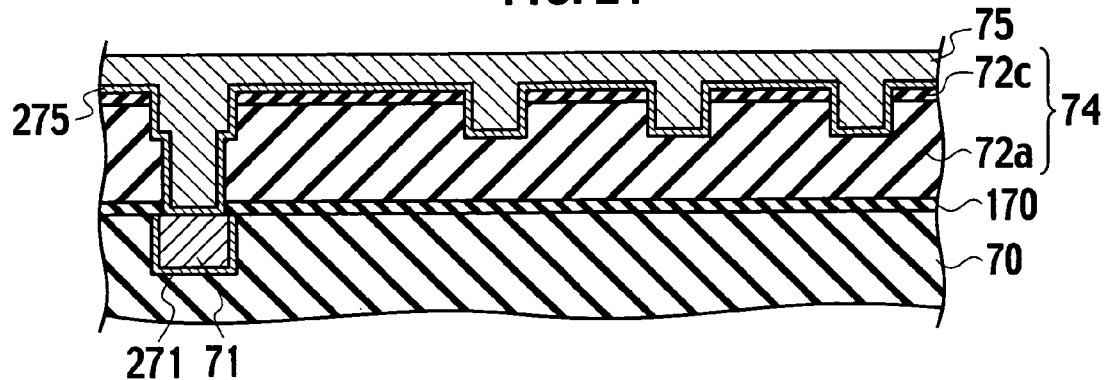

The semiconductor substrate having the second interlevel dielectric film 74 on which the interconnect groove 76, the via hole 78, and the dummy grooves 77i, 77j, and 77k are formed, is loaded to a sputtering apparatus, for example. The hole layer insulating film 72a is subjected to degasification by heating the second interlevel dielectric film 74. Thereafter, a barrier layer 275 and a seed film are deposited by sputtering. Moreover, as shown in FIG. 21, a filler film is deposited, by electroplating, sputtering, CVD, and the like, to form a conductive film 75 so as to cover the second interlevel dielectric film 74. The conductive film 75 fills the interconnect groove 76, the via hole 78, and the dummy grooves 77i, 77j, and 77k, respectively. For example, a refractory metal film, such as Ta, Nb, Ti, W and V, a nitride film of the refractory metal, a laminated film including the refractory metal and the nitride of the refractory metal, and the like is used as the barrier layer 275. Metal containing Cu as a main component is used for the seed film and the filler film.

Figure 22:
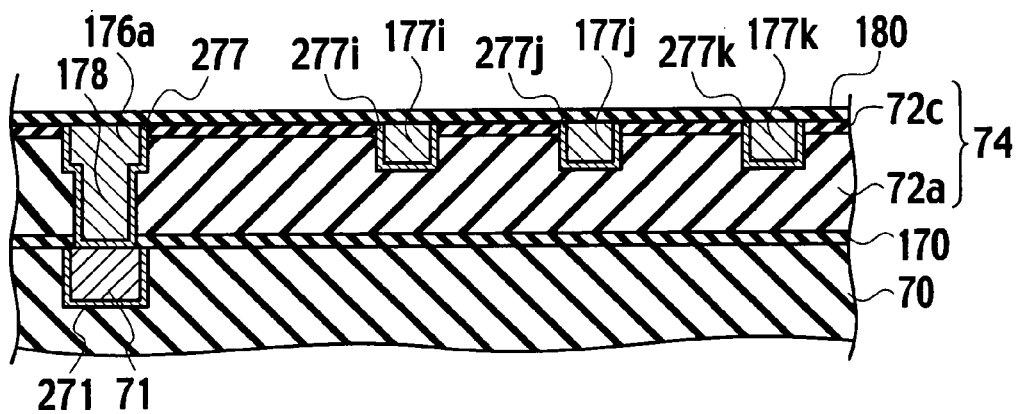

The conductive film 75 and the barrier layer 275 are planarized, by CMP and the like, so as to reveal a surface of the cap insulating film 72c of the second interlevel dielectric film 74. As shown in FIG. 22, a diffusion barrier film 180 is deposited on the planarized surface. Thus, an interconnect 176a, a plug 178 for connecting the interconnect 176a to the conductive film 71, and dummy interconnects 177i, 177j, and 177k are formed. A barrier layer 277 is formed on the interconnect 176a and plug 178, and barrier layers 277i, 277j, and 277k are formed on the dummy interconnects 177i, 177j, and 177k, respectively.

Figure 23:
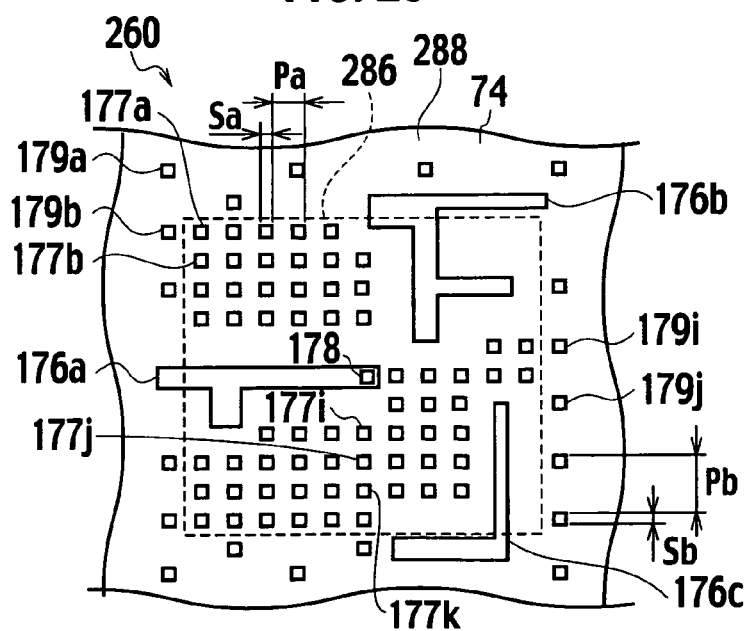
FIG. 23 is a view showing an example of a semiconductor device according to the embodiment of the present invention.

As shown in FIG. 23, the interconnects 176a, 176b, and 176c buried in the interconnect grooves formed on the surface of the second interlevel dielectric film 74 are provided in an interconnect area 260. The dummy interconnects 177a, 177b, . . . , 177i, 177j, 177k, . . . , (first dummy interconnects) having a first width Sa are arranged with a first pitch Pa in a first area 286 within the interconnect area 260. The first area 286 includes the plug 178 connected to the bottom surface of the interconnect 176a. Additionally, dummy interconnects 179a, 179b, . . . , 179i, 179j, . . . , (second dummy interconnects) having a second width Sb are arranged with a second pitch Pb which is different from the first pitch Pa, in a second area 288 within the interconnect area 260 excluding the first area 286. In the example shown in FIG. 23, the first width Sa is almost the same as the second width Sb. However, the first and second widths Sa, Sb may be different. From the viewpoint of efficiently implementing degasification of the first area 286 in which the plug 178 is arranged, it is desirable to set the first width Sa smaller than the second width Sb.

In the method for manufacturing a semiconductor device according to the embodiment of the present invention, the dummy grooves 77i, 77j, and 77k are formed around the interconnect groove 76 and the via hole 78 by removing the cap insulating film 72c having low gas permeability. Therefore, it is possible to implement degasification of the hole layer insulating film 72*a* efficiently. As a result, it is possible to suppress oxidation or modification of the surfaces of barrier layer 277 in the interconnect 176*a*, 176*b*, 176*c* and the plug 178, and to prevent interconnect defects, such as high resistance or disconnection, between the interconnect layers.

The dependence of resistance of the plug 178 formed in the second interlevel dielectric film 74 on the local pattern density is evaluated by changing the pitch and the size of the additional patterns. For example, as a critical value of resistance of the plug 178, the pitch and the size of the plug 178, which correspond to a measured resistance value that is increased by 100% as compared to a design specification value, are determined. A low-k insulating film having a relative dielectric constant in a range from about 2.2 to about 2.6 (hereinafter referred to as a dielectric A) and a low-k insulating film having a relative dielectric constant in a range from about 2.4 to about 2.8 (hereinafter referred to as a dielectric B) are used as the hole layer insulating film 72*a*. Ta and Ti are used as the barrier layer 277. Here, a width of the additional pattern is used as the size of the additional pattern. Moreover, as the hole layer insulating film 72*a* and the barrier layer 277, for example, if a combination of the insulating film A and Ta metal is used, the combination will be described as "dielectric A-Ta".

Figure 24:
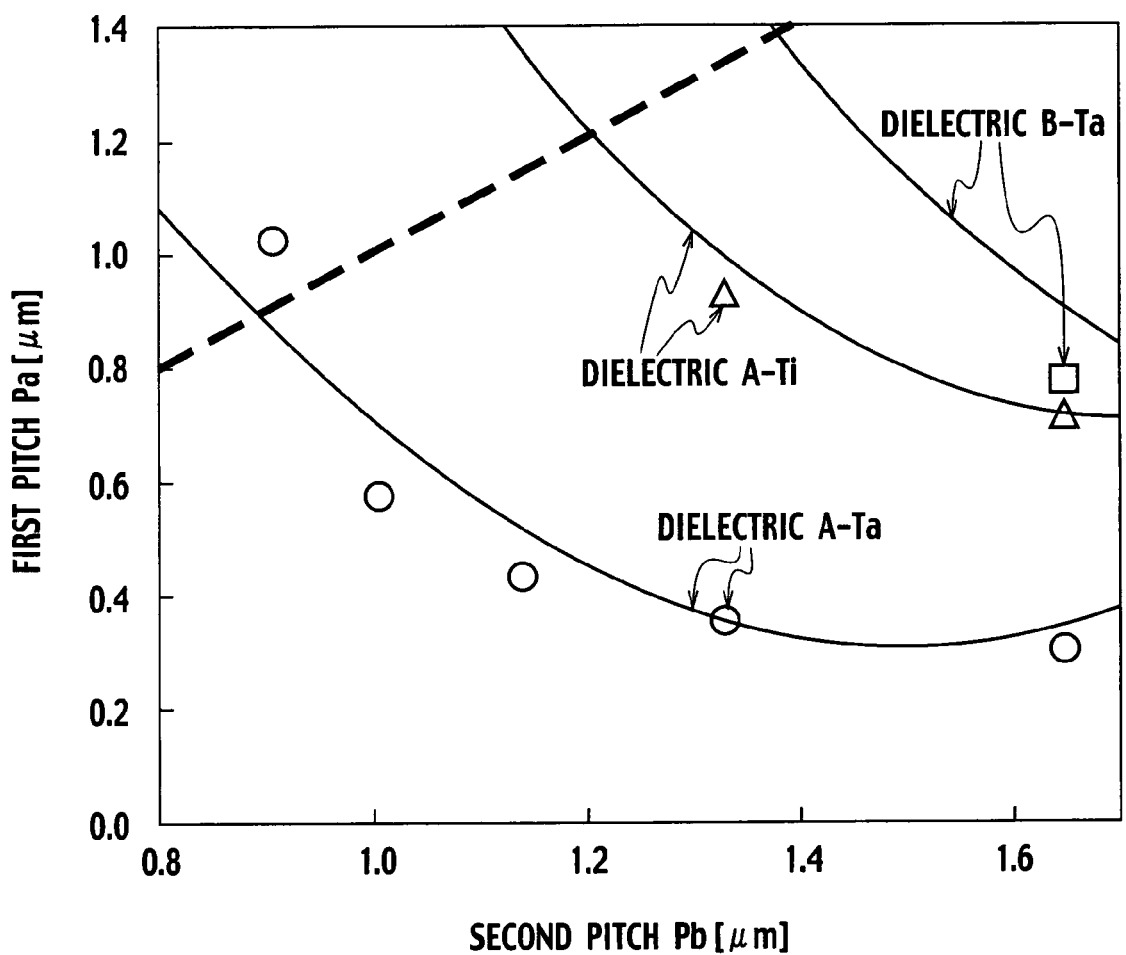
FIG. 24 is a graph showing examples of relations between plug resistance and a pitch of the dummy pattern.
Figure 25:
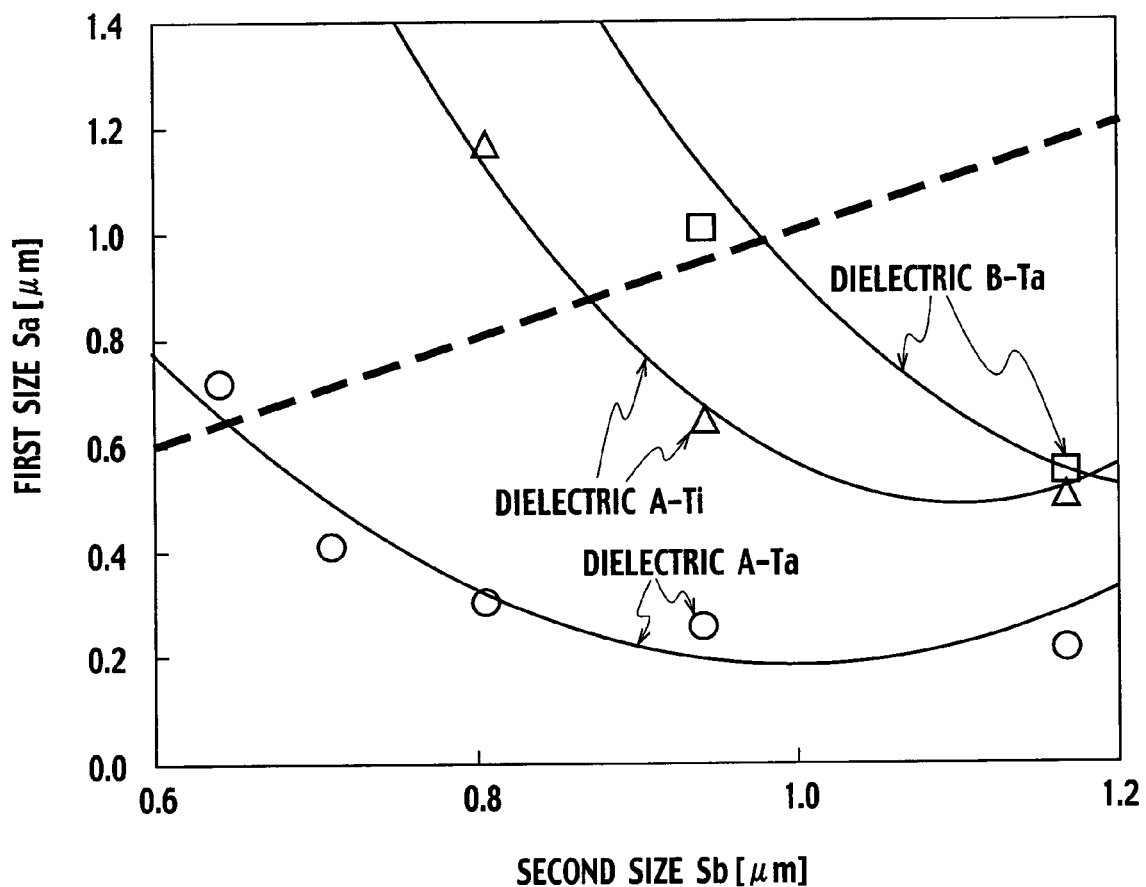
FIG. 25 is a graph showing examples of relations between plug resistance and a size of the dummy pattern.

As shown in FIG. 24, for a condition where plug resistance is equal to the critical value, if the second pitch Pb is decreased, the first pitch Pa is increased. Additionally, as shown in FIG. 25, for a condition where plug resistance is equal to the critical value, if the second pitch Pb is decreased, the first size Sa is increased. Here, solid lines and dotted lines shown in FIGS. 24 and 25, respectively represent fitting curves of the measured values, and straight lines where the first and second pitches Pa and Pb are equal to each other.

The first and second pitches Pa and Pb that are equal to or below the applicable fitting curve are selected to render the plug resistance less than the critical value. Moreover, it is desirable to set the local pattern density of the first area, in which the plug is arranged, higher than that of the second area. For example, for the combinations of "dielectric A-Ta", "dielectric A-Ti", and "dielectric B-Ta", the relationship between the first and second pitches Pa and Pb to render the plug resistance less than the critical value can be expressed as follows:

$$Pa < 1.6 \times (Pb - 1.5)^2 + 0.3, Pa < Pb \quad (1)$$

$$Pa < 2.1 \times (Pb - 1.7)^2 + 0.7, Pa < Pb \quad (2)$$

$$Pa < 1.6 \times (Pb - 1.95)^2 + 0.7, Pa < Pb \quad (3)$$

On the other hand, the relationship between the first and second widths Sa and Sb can be expressed as follows:

$$Sa < 3.7 \times (Sb - 1)^2 + 0.18, Sa < Sb \quad (4)$$

$$Sa < 7.5 \times (Sb - 1.1)^2 + 0.48, Sa < Sb \quad (5)$$

$$Sa < 6.5 \times (Sb - 1.25)^2 + 0.5, Sa < Sb \quad (6)$$

Additionally, as shown in FIGS. 24 and 25, the critical value of the plug resistance depends on the materials of the hole layer insulating film and the barrier layer. To render the plug resistance less than the critical value, it is necessary to reduce the pitch and the size more in the dielectric A compared to the dielectric B, and in the Ta metal compared to the Ti metal. More specifically, the dielectric A is the porous film having a smaller relative dielectric constant than the dielectric B. Thus, the insulating film A easily absorbs water, residual gas components, and the like. Additionally, a surface of Ta is more susceptible to oxidation or modification compared to Ti.

As described above, the first and second pitches Pa and Pb, and the first and second widths Sa and Sb may be appropriately selected to render the plug resistance less than the critical value. In addition, the dummy patterns having pitches and sizes corresponding to the first and second pitches Pa and Pb, and the first and second widths Sa and Sb, may be generated in the first and second processing areas corresponding to the first and second areas. In the above explanation, the resistance value increased by 100% as compared to the design specification value, is used as the critical value. However, the critical value may be an arbitrary value, which may be a resistance value determined based on a performance required by the semiconductor device, for example.

Figure 26:
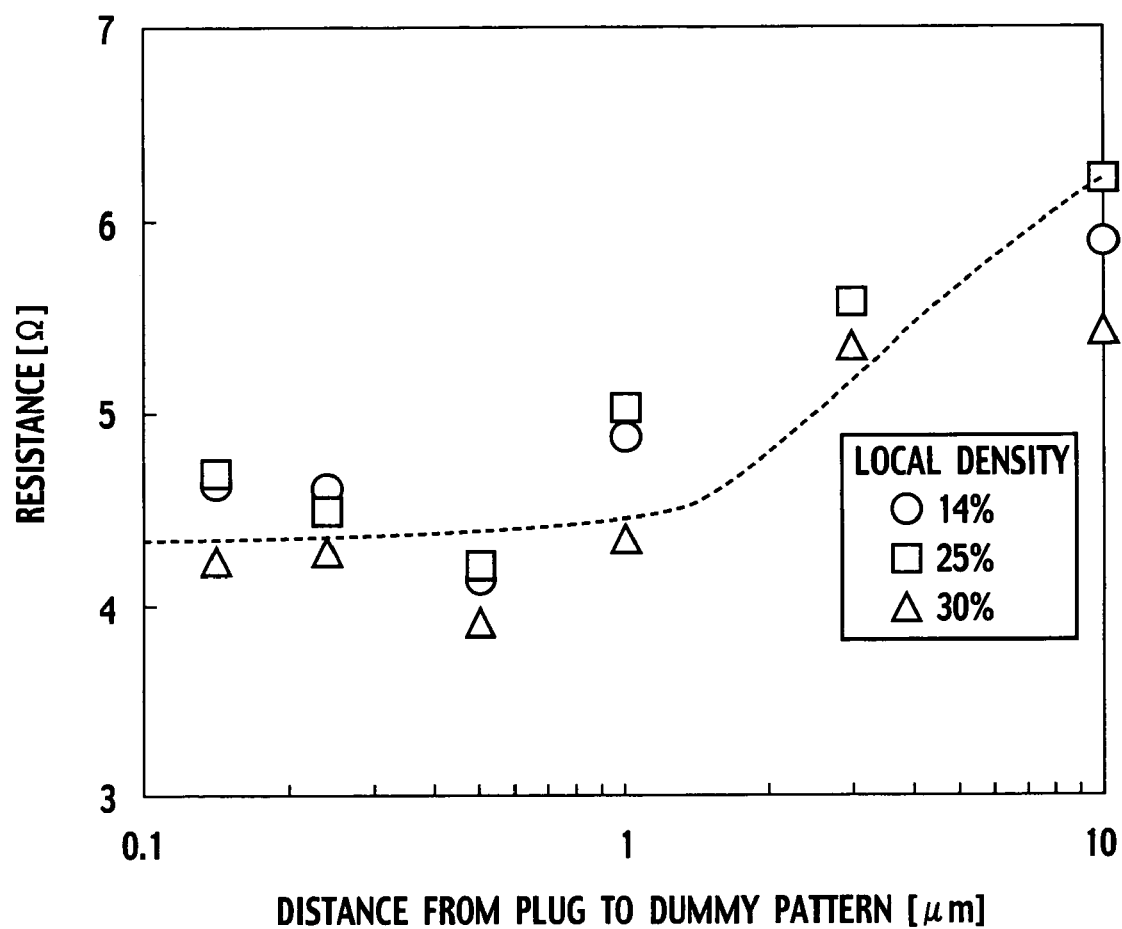
FIG. 26 is a graph showing examples of relations between plug resistance and a distance from the plug to the dummy pattern.

Additionally, as shown in FIG. 26, the measured value of the plug resistance depends on a distance between the plug and a dummy pattern adjacent thereto. For a plug having a diameter of about 75 nm, in each case where the local pattern density of the dummy patterns is equal to about 14%, about 25%, and about 30%, the plug resistance remains almost constant if the distance between the plug and the dummy pattern is within about one μm. The plug resistance is increased if the distance between the plug and the dummy pattern exceeds about one μm. Therefore, for a plug having a diameter of about 75 nm, it is possible to suppress an increase in plug resistance when the distance between the plug and the dummy pattern is with in about one μm. The maximum distance between the plug and the dummy pattern that satisfies almost constant plug resistance is increased if the diameter of the plug is increased. However, the relation of the diameter of the plug to the maximum value of the distance between the plug and the dummy pattern is almost the same. More specifically, it is possible to suppress the increase in plug resistance if the distance between the plug and the dummy interconnect is within about 13 times the diameter of the plug.

Corresponding to the designated restricted area based on the design rule, the additional patterns are not provided around the plug. For example, a range of the restricted area is wide, and when the distance between the plug and the adjacent dummy pattern become larger than about 13 times the diameter of the plug. If it is necessary to suppress the increase of plug resistance in order to achieve performance of the semiconductor device, it is desirable to select a distance which is about 13 times the diameter of the plug, as an upper limit of the restricted area.

Figure 17:
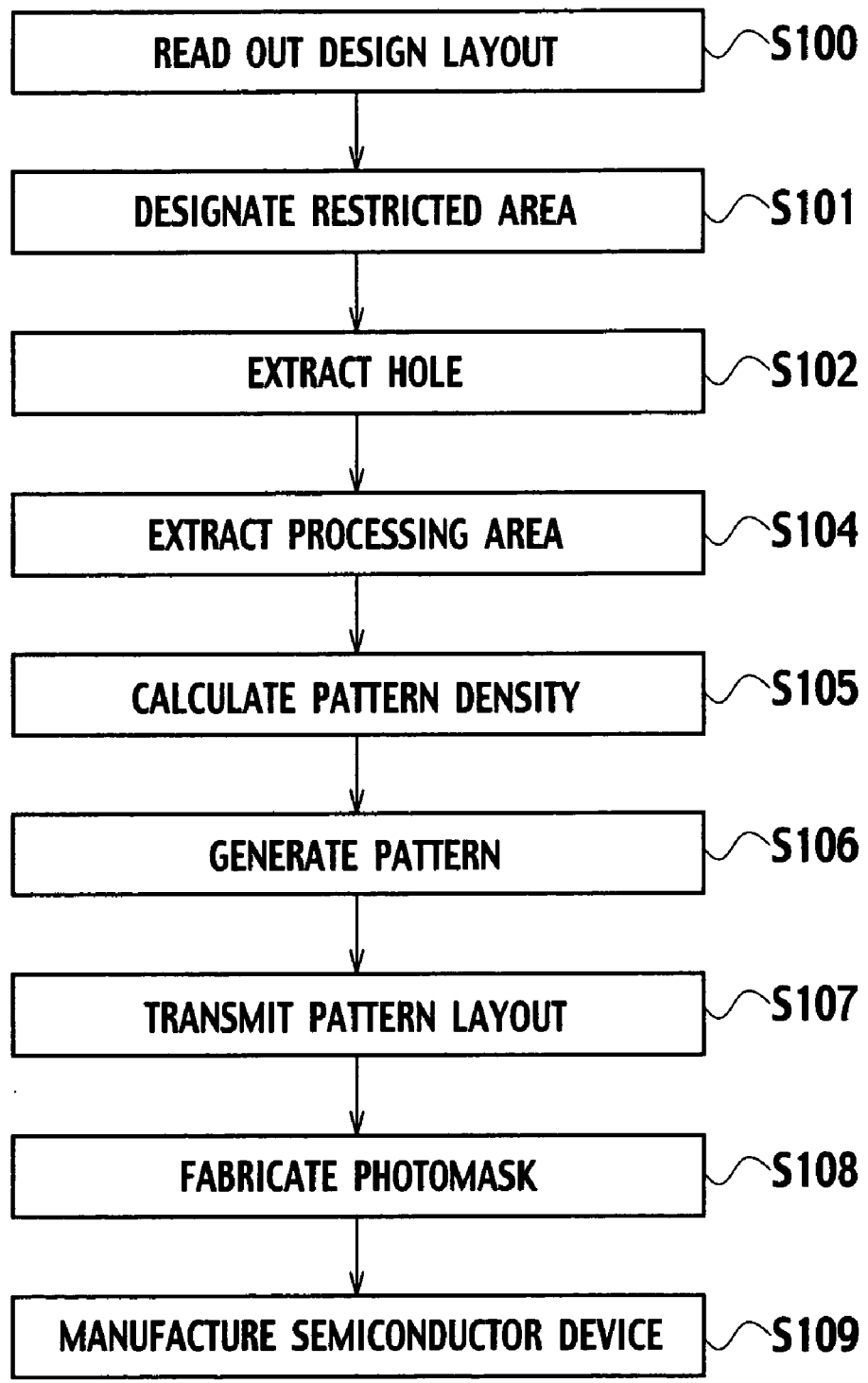
FIG. 17 is a flowchart showing an example of a method for generating a pattern according to the embodiment of the present invention.

The series of pattern generation processing shown in FIG. 17 can be executed by controlling the pattern generation system shown in FIG. 1 by use of a program including algorithms equivalent to the flow chart of FIG. 17. The program may be stored in a program storage device (not shown) in the computer system used as the pattern generation system. Alternatively, the series of the pattern generation processing can be executed by saving the program in a computer-readable recording medium and having the program storage device of the pattern generation system to read out the program from the recording medium.

Here, the "computer-readable recording medium" may be a medium which can record the program, such as an external memory device for a computer, a semiconductor memory, a magnetic disk, an optical disk, a magneto-optical disk, and a magnetic tape. To be more precise, a flexible disk, a CD-ROM, an MO disk, and the like are included in the "computer-readable recording media".

For example, it is possible to set up a main body of the pattern generation system to incorporate or externally connect a flexible disk device (a flexible disk drive) and an optical disk device (an optical disk drive). A flexible disk is inserted from an inlet to the flexible disk drive or a CD-ROM is inserted from an inlet to the optical disk drive. Then, by implementing a predetermined reading operation, it is possible to install the program stored in the recording medium in the program storage device used for the pattern generation system. Alternatively, it is possible to use a ROM as a memory device used for a game package and the like or a cassette tape as a magnetic tape device, for example, by connecting an applicable drive device. In addition, it is possible to store the program in the program storage device through an information processing network such as the Internet.

(Modification)

Figure 27:
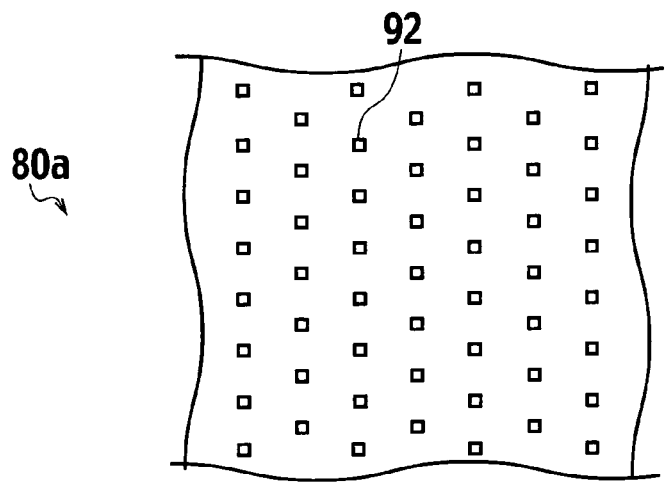
FIGS. 27 to 29 are views showing an example of dummy patterns generated in the pattern processing area according to a modification of the embodiment of the present invention.

In a method for generating a pattern according to a modification of the embodiment of the present invention, the pattern density for the interconnect patterns 62a, 62b, and 62c is calculated for the entire plane of a pattern processing area 80a for arranging the interconnect layout 60 shown in FIG. 2. As shown in FIG. 27, dummy patterns 92 are generated on the entire plane of the pattern processing area 80a based on the calculated pattern density.

Figure 28:
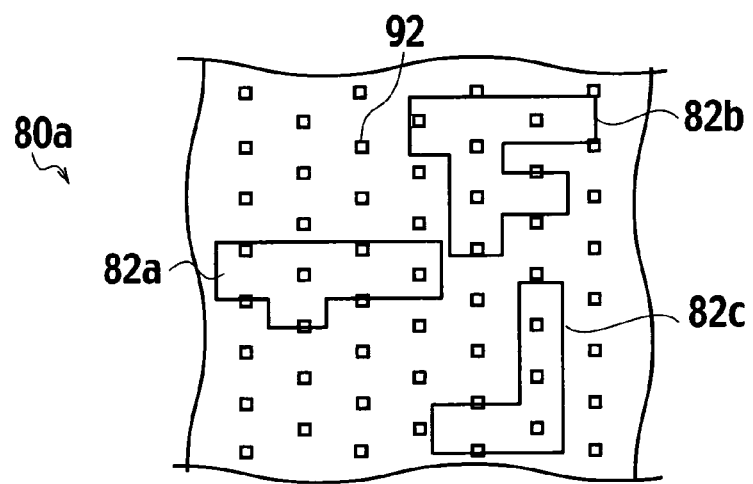
Figure 29:
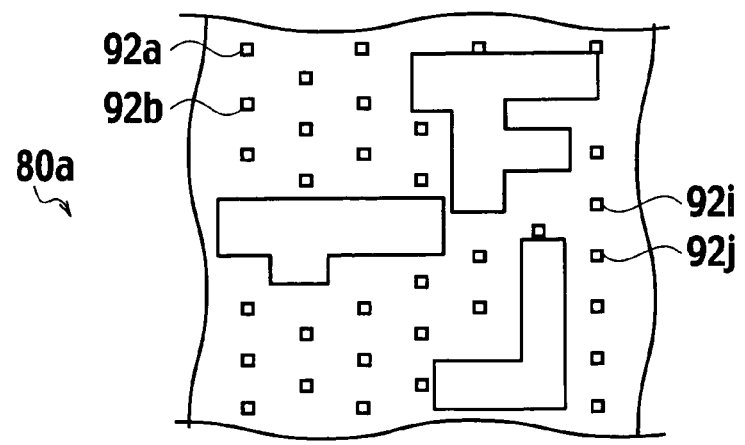

As shown in FIG. 28, the restricted areas 82a, 82b, and 82c shown in FIG. 6 are designated in the pattern processing area 80a. As shown in FIG. 29, the dummy patterns 92a, 92b, . . . , 92i, 92j, . . . , are provided by deleting the dummy patterns 92 overlapping the designated restricted areas 82a to 82c.

Figure 30:
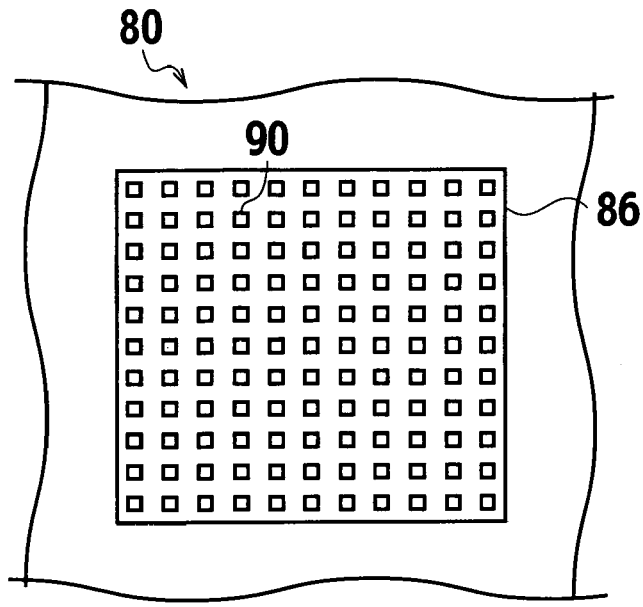
FIGS. 30 to 32 are views showing an example of the dummy patterns generated in the first processing area according to the modification of the embodiment of the present invention.
Figure 31:
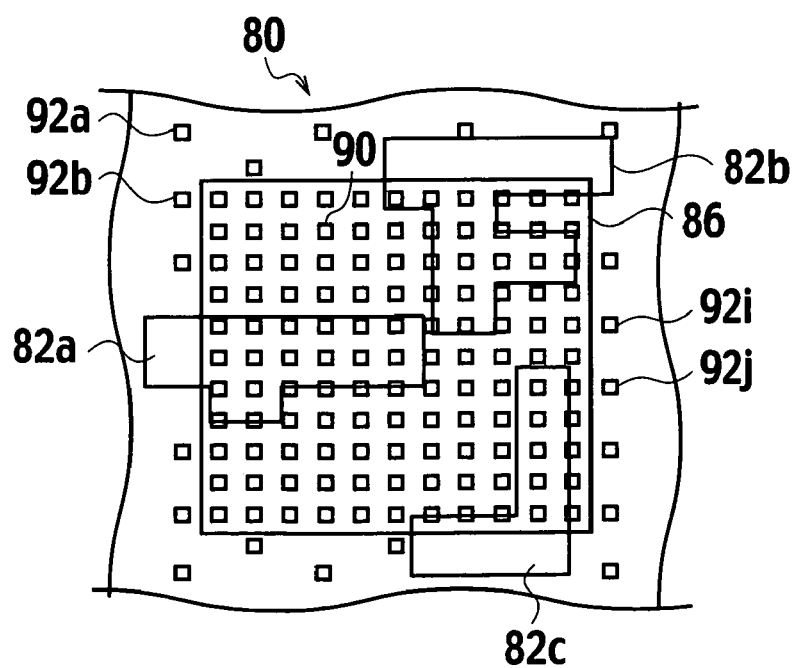
Figure 32:
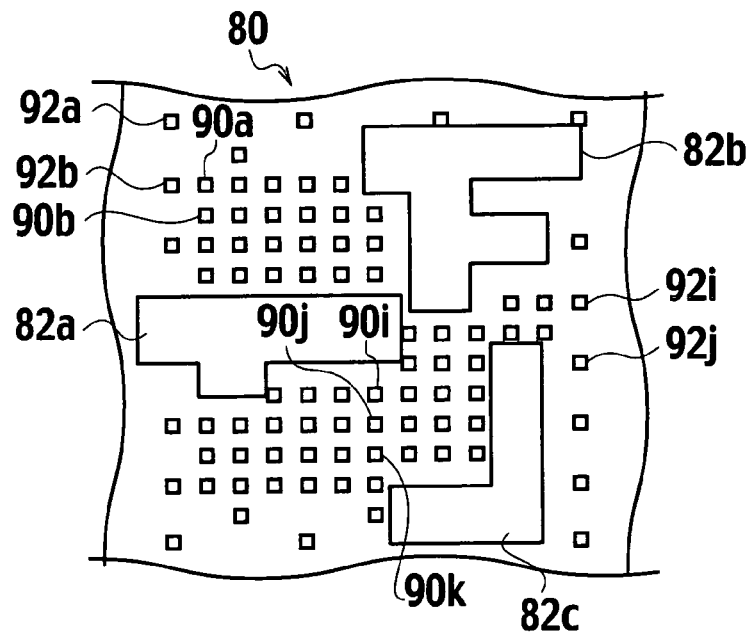
Figure 33:
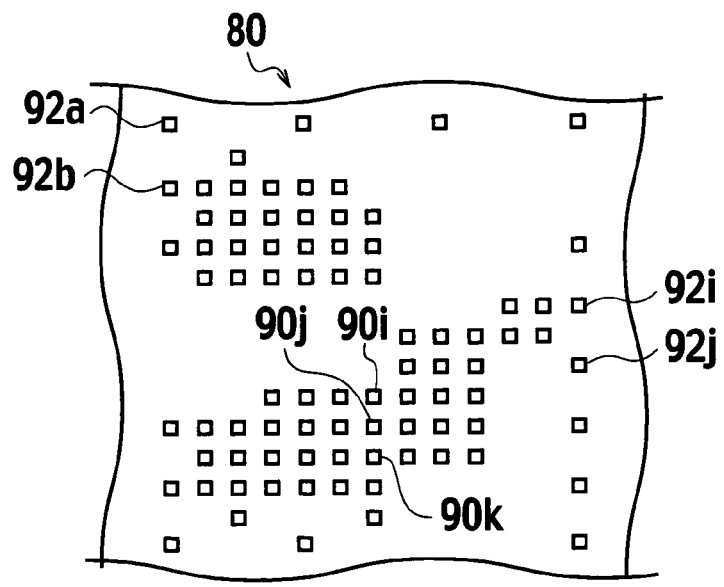
FIG. 33 is a view showing an example of the dummy patterns arranged in the pattern processing area according to the modification of the embodiment of the present invention.

Next, the first processing area 86 is designated in a pattern processing area 80 similar to the embodiment of the present invention, and the pattern density is calculated for the interconnect patterns 62a to 62c in the first processing area 86. Based on the calculated pattern density, as shown in FIG. 30, the dummy patterns 90 are generated on the entire plane of the first processing area 86. As shown in FIG. 31, the restricted areas 82a to 82c and the dummy patterns 92a to 92j, . . . , provided in the pattern processing area 80a are superposed onto the pattern processing area 80. As shown in FIG. 32, the dummy patterns 90a, 90b, . . . , 90i, 90j, 90k, . . . , are provided by deleting the dummy patterns 90 overlapping the restricted areas 82a to 82c. As a result, even in the modification of the embodiment similar to the embodiment of the present invention, as shown in FIG. 33, the dummy patterns 90a to 90k, . . . , and 92a to 92j, . . . , are generated in the pattern processing area 80.

A method for generating a pattern according to the modification of the embodiment is different from the embodiment of the present invention in that the dummy patterns 92 are generated in the pattern processing area 80a and the dummy patterns 92 overlapping the restricted areas 82a to 82c are deleted. A further difference is that the dummy patterns 90 are generated in the first processing area 86 and the dummy patterns 90 overlapping the restricted areas 82a to 82c are deleted. Other configurations are similar to the embodiment of the present invention, so duplicate description will be omitted.

Figure 34:
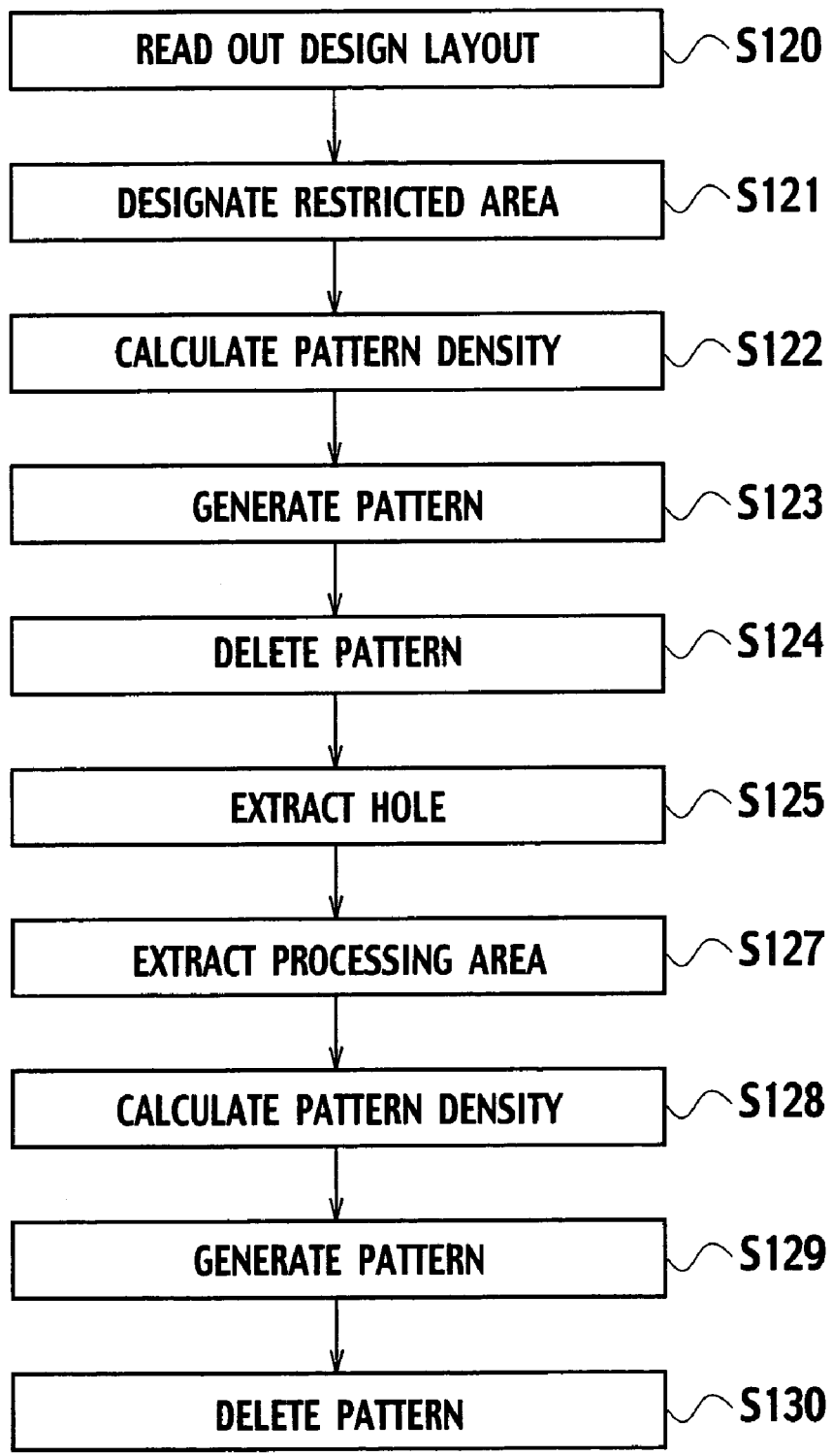
FIG. 34 is a flowchart showing an example of a method for generating a pattern according to the modification of the embodiment of the present invention.

Next, a method for generating a pattern according to the modification of the embodiment of the present invention will be described by use of a flowchart shown in FIG. 34. Here, the circuit layouts of the semiconductor device are stored in the design information file 20 of the external memory 16 shown in FIG. 1.

In Step S120, the input module 30 of the pattern generation unit 10 shown in FIG. 1 reads out the interconnect layout 60 and the hole layout 64 shown in FIGS. 2 and 3, from the design information file 20.

In Step S121, the area designation module 32 designates the restricted areas 82a, 82b, and 82c shown in FIG. 6, respectively, in the peripheries of the interconnect patterns 62a, 62b, and 62c based on the predetermined design rule.

In Step S122, the density calculation module 38 calculates the pattern density of the interconnect patterns 62a to 62c for the pattern processing area 80a sown in FIG. 27.

In Step S123, the pattern processing module 40 generates the dummy patterns 92 based on the calculated pattern density.

In Step S124, the pattern processing module 40 deletes the dummy patterns 92 which overlap the restricted areas 82a to 82c designated in the pattern processing area 80a.

In Step S125, the pattern extraction module 34 extracts the hole pattern 66 overlapping the interconnect pattern 62a from the hole layout 64 arranged in the pattern processing area 80.

In Step S127, the area extraction module 36 extracts the first processing area 86 shown in FIG. 7 in the peripheral area surrounding the hole pattern 66.

In Step S128, the density calculation module 38 calculates the pattern density of the interconnect patterns 62a to 62c in the first processing area 86.

In Step S129, the pattern processing module 40 generates the dummy patterns 90 in the first processing area 86 based on the calculated pattern density.

In Step S130, the pattern processing module 40 deletes the dummy patterns 90 which overlap the restricted areas 82a to 82c designated in the pattern processing area 80.

Thus, the dummy patterns 90a to 90k, . . . , and 92a to 92j, . . . , are generated in the pattern processing area 80. Subsequently, the dummy patterns 90a to 90k, . . . , and 92a to 92j, . . . shown in FIG. 33, are added to the interconnect layout 60 shown in FIG. 2, and the interconnect layout 60a shown in FIG. 12 is provided.

In the method for generating a pattern according to the modification of the embodiment, it is possible to generate additional patterns, such as the dummy patterns, so as to increase the pattern density in the processing area around the isolated pattern.

In addition, in the dummy patterns 92a to 92j, . . . , the dummy patterns 92 added to the first processing area 86 may partially overlap the dummy patterns 90a to 90k, . . . . In an actual operation, in view of the increase in the processing time because of the increase in the amount of processing, the dummy patterns 92 added to the first processing area 86 may be deleted.

Other Embodiments

Figure 35:
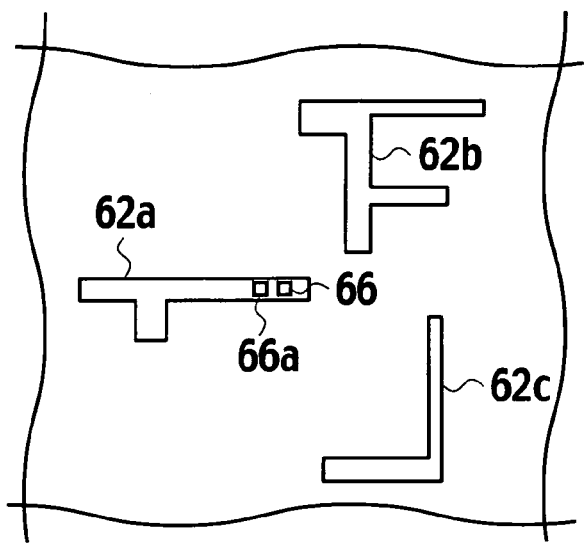
FIG. 35 is an overlay view showing an example of the inter connect and hole layouts used for explaining other embodiments of the present invention.
Figure 36:
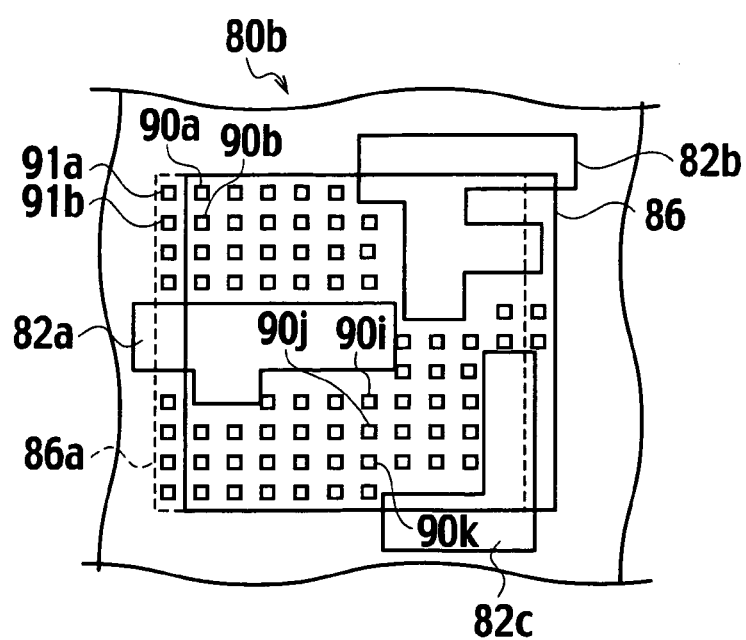
FIG. 36 is a view showing an example of the dummy patterns generated in the first processing area according to the other embodiments of the present invention.

The embodiment of the present invention is described by use of the hole pattern 66 overlapping the interconnect patterns 62a to 62c. However, a plurality of hole patterns may overlap the interconnect patterns 62a to 62c. For example, as shown in FIG. 35, adjacent hole patterns 66 and 66a overlap the interconnect pattern 62a. In such a case, as shown in FIG. 36, the first processing area 86 corresponding to the hole pattern 66 and another first processing area 86a corresponding to the hole pattern 66a may be extracted in the pattern processing area 80b. Here, the dummy patterns 90a 90b, . . . , 90i, 90j, 90k, . . . , may be generated for the first processing area 86, and dummy patterns 91a, 91b, . . . , may be generated in a portion of the first processing area 86a. The dummy patterns 91a, 91b, . . . do not overlap the first processing area 86.

Figure 37:
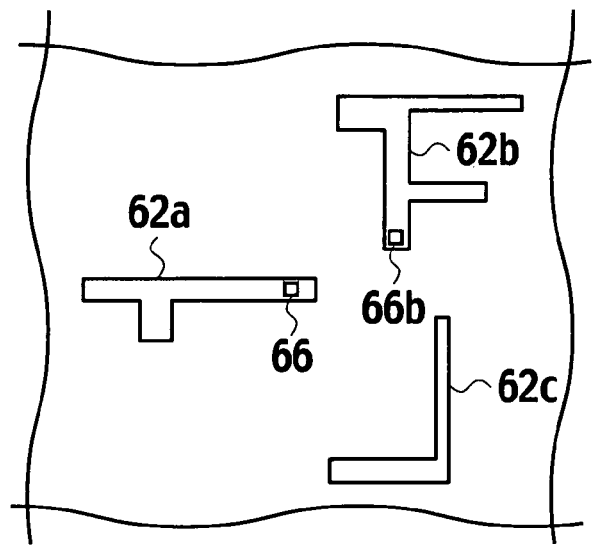
FIG. 37 is an overlay view showing another example of the interconnect and hole layouts used for explaining other embodiments of the present invention.
Figure 38:
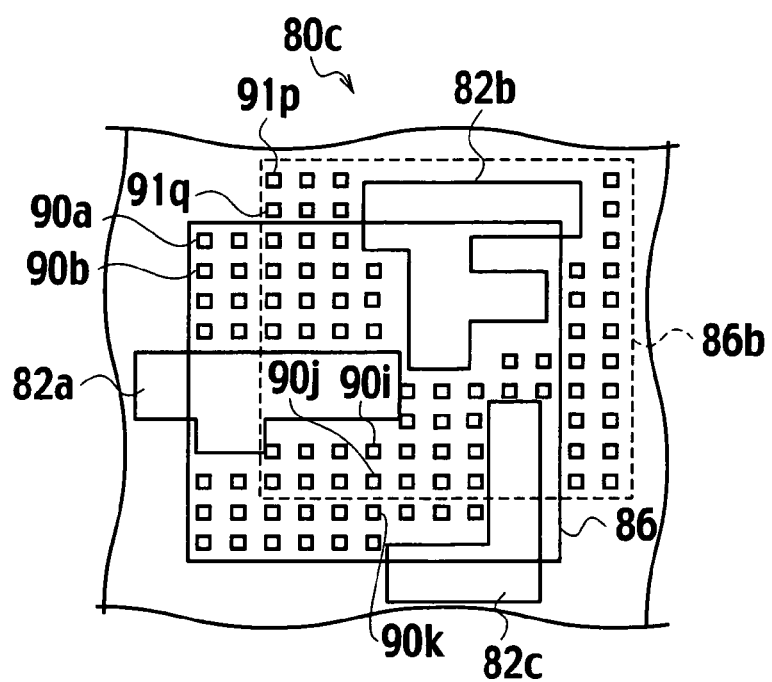
FIG. 38 is a view showing another example of the dummy patterns generated in the first processing area according to the other embodiments of the present invention.

Additionally, as shown in FIG. 37, hole patterns 66 and 66b overlap the interconnect patterns 62a and 62b, respectively. In such a case, as shown in FIG. 38, the first processing area 86 corresponding to the hole pattern 66 and another first processing area 86b corresponding to the hole pattern 66b may be extracted in the pattern processing area 80c. Here, the dummy patterns 90a to 90k, . . . , may be generated for the first processing area 86, and dummy patterns 91p, 91q, . . . , may be generated in a portion of the first processing area 86b. The dummy patterns 91p, 91q, . . . do not overlap the first processing area 86.

Figure 39:
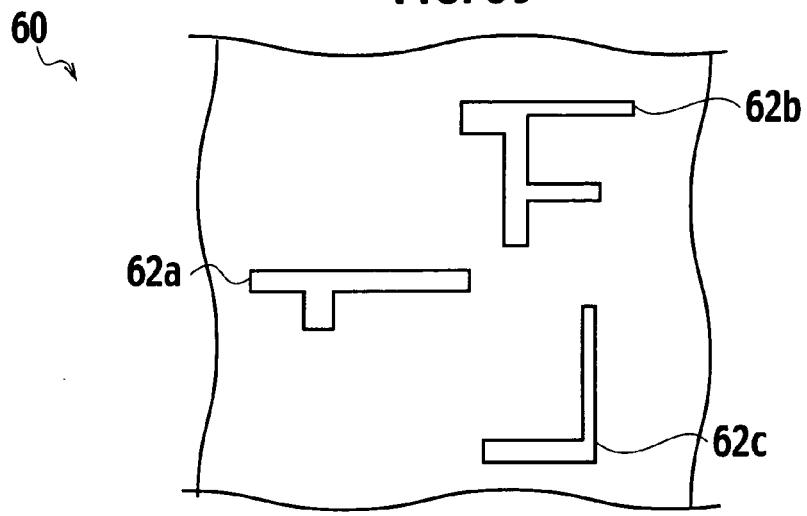
FIG. 39 is a view showing an example of the interconnect layout created by a method for generating a pattern according to the other embodiments of the present invention.
Figure 40:
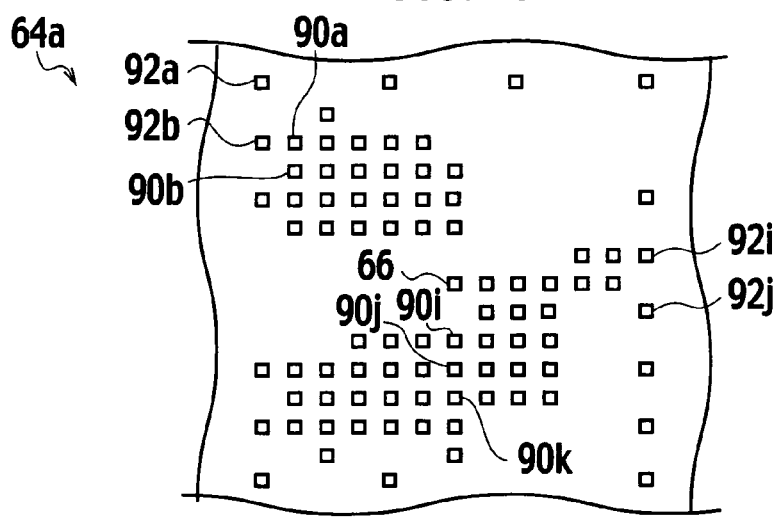
FIG. 40 is a view showing an example of the hole layout created by a method for generating a pattern according to the other embodiments of the present invention.
Figure 41:
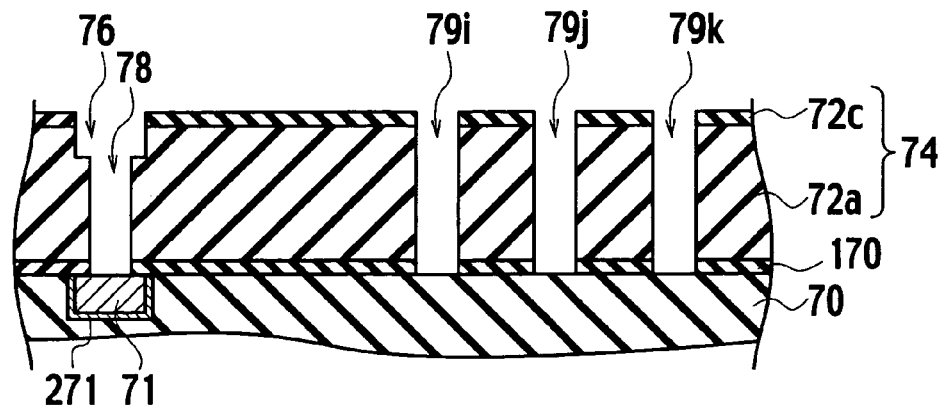
FIG. 41 is a cross sectional view showing an example of an interconnect layer manufactured based on the interconnect layout created by a method for generating a pattern according to the other embodiments of the present invention.

Moreover, in the embodiment of the present invention, the additional patterns are generated in the interconnect layout 60a while the original hole layout 64 is used without changing the design layout, as shown in FIGS. 12 and 13. For example, as shown in FIGS. 39 and 40, it is possible to use the original interconnect layout 60 without changing the design layout and to generate the dummy patterns 90a to 90k, . . . , and 92a to 92j, . . . , in a hole layout 64a as the additional patterns by avoiding interconnect patterns in a underlying layer, as appropriate. As shown in FIG. 41, by the photomasks fabricated based on interconnect layout 60 and the hole layout 64a in which the additional patterns are arranged, dummy holes 79i, 79j, and 79k are formed in the second interlevel dielectric film 74 in peripheral areas of the interconnect groove 76 and the via hole 78. Even in such a case, degasification of the hole layer insulating film 72a of the second interlevel dielectric film 74 can be efficiently implemented through the interconnect groove 76, the via hole 78, and the dummy holes 79i to 79k. In addition, it is possible to apply the hole layout 64a to a single damascene process.

Figure 42:
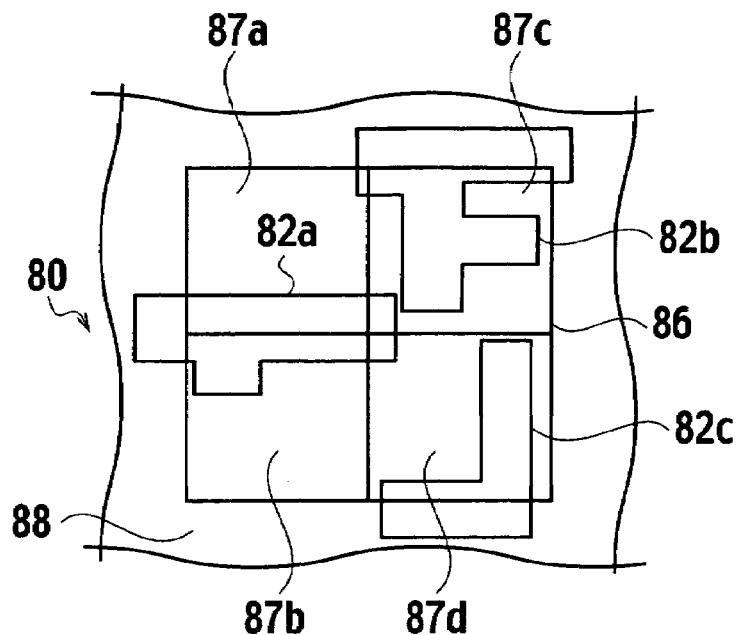
FIG. 42 is a view showing an example of subareas of the first processing area according to the embodiment of the present invention.
Figure 43:
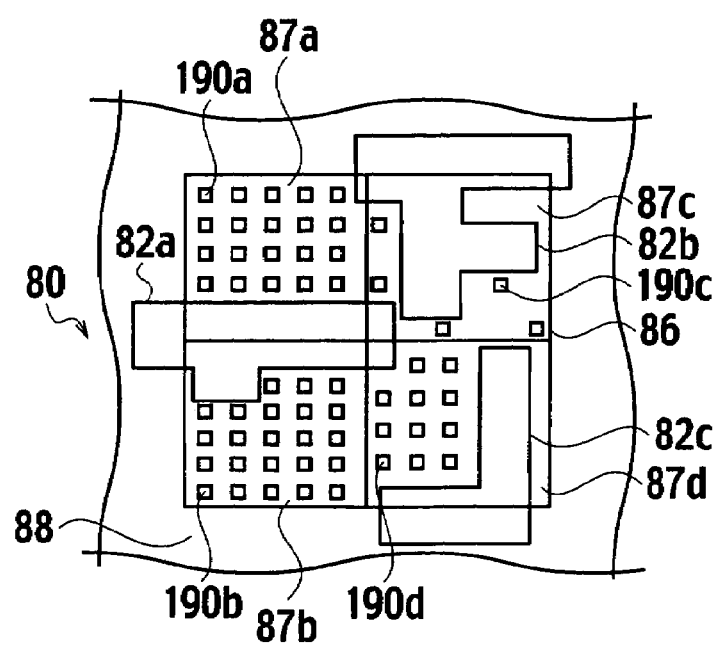
FIG. 43 is a view showing an example of the dummy patterns generated in the subareas of the first processing area according to the other embodiments of the present invention.

Additionally, as shown in FIG. 7, the first processing area 86 is designated around the hole pattern 66. As shown in FIG. 42, it is also possible to divide the first processing area 86 into a plurality of subareas, for example, into four subareas designated as 87a, 87b, 87c, and 87d. In such a case, the pattern density of the interconnect patterns is calculated for the respective subareas 87a to 87d. Based on the calculated pattern density, as shown in FIG. 43, dummy patterns 190a, 190b, 190c, and 190d are generated in the respective subareas 87a to 87d. Therefore, it is possible to generate the additional patterns effectively in an isolated pattern such as the interconnect pattern 62a, of which the pattern density is distributed in the first processing area 86.

Moreover, in the embodiment of the present invention and the modification of the embodiment, the first processing area 86 is extracted in the peripheral area of the interconnect pattern 62a to be connected to the hole pattern 66. However, it is possible to extract a plurality of first processing areas 86. For example, the first processing area 86 having a predetermined area as an inspection area is shifted at a predetermined interval in the peripheral area of the interconnect pattern 62a to be connected to the hole pattern 66, and the pattern density is calculated for the respective first processing areas 86. Dummy patterns are generated in the plurality of first processing areas 86 which have a pattern density smaller than the reference value by implementing logic sum graphic processing, as shown in FIG. 36 or FIG. 38. As the interval for shifting the inspection area becomes smaller, accuracy of extracting the first processing areas 86 with the smaller pattern density than the reference value will be improved. However, the amount of processing may be increased by applying the smaller interval. Therefore, the interval for shifting the inspection area may be appropriately determined by taking into consideration the film quality of the hole layer insulating film, the distribution of pattern density in the target peripheral area, processing time, and the like.

In addition, in the embodiment of the present invention and the modification of the embodiment, the first processing area 86 is extracted after extracting the hole pattern 66 to be connected to the interconnect pattern 62a, as shown in FIGS. 16 and 33. However, the procedures for extracting the first processing area 86 is not limited. It is possible to change the procedures as described below. Specifically, inspection areas, each having the same predetermined area as the first processing area 86, are designated throughout the pattern processing area 80a in which the interconnect patterns 62a to 62c are arranged, and the pattern density is calculated for the respective inspection areas. Subsequently, the inspection areas having a smaller pattern density than the reference value are extracted. Among the extracted inspection areas, the inspection area including the hole pattern 66 to be connected to the interconnect pattern 62a may be extracted as the first processing area 86. Even in such a case, it is possible to extract the plurality of first processing areas 86 as a consequence of calculating the pattern density for the respective inspection areas by shifting the inspection area including the predetermined area at the predetermined interval.

Additionally, in the modification of the embodiment, as shown in FIGS. 29 and 31, the dummy patterns 92a to 92j, . . . generated in the pattern processing area 80a are superposed on the dummy pattern 90 generated in the first processing area 86, in the pattern processing area 80a. However, it is possible to generate the dummy patterns 90 by extracting the first processing area 86 in the pattern processing area 80a where the dummy patterns 92a to 92j, . . . are arranged.

For example, inspection areas, each having the same predetermined area as the first processing area 86, are shifted at the predetermined interval throughout the pattern processing area 80a in which the interconnect patterns 62a to 62c and the dummy patterns 92a to 92j, . . . are arranged. The pattern density is calculated for the respective inspection areas. Then, the inspection areas having a pattern density smaller than the reference value are extracted. Among the extracted inspection areas, the inspection area including the hole pattern 66 to be connected to the interconnect pattern 62a is extracted as the first processing area 86.

The dummy patterns 92a to 92j, . . . have already been arranged in the pattern processing area 80a, and the pattern density has been increased. As a result, the number of extracted inspection areas is decreased and the processing time may decrease. Thus, it is possible to generate the additional patterns in the peripheral area of the interconnect pattern 62a even more effectively.

Various modifications will become possible for those skilled in the art after storing the teachings of the present disclosure without departing from the scope thereof.

What is claimed is:

1. A semiconductor device, comprising:
   an interconnect provided in an interconnect area on a surface of an insulating film;
   a plug connected to a bottom surface of the interconnect in a first area within the interconnect area;
   first dummy interconnects provided in the first area within the interconnect area, being arranged in a two-dimensional array with a first pitch, the first dummy interconnects having a first size and a first local pattern density, the first local pattern density being defined as a fractional area occupied by one of the first dummy interconnects within an area provided by the first pitch on a surface of the first area; and
   second dummy interconnects provided in a second area excluding the first area within the interconnect area, being arranged in a two-dimensional array with a second pitch, the second dummy interconnects having a second size and a second local pattern density, the second local pattern density being defined as a fractional area occupied by one of the second dummy interconnects within an area provided by the second pitch on a surface of the second area, at least one of the second pitch, the second size, and the second local pattern density being different from the first pitch, the first size, and the first local pattern density, wherein the first local pattern density is greater than the second local pattern density.

2. The semiconductor device of claim 1, wherein the first pitch is smaller than the second pitch.

3. The semiconductor device of claim 2, wherein the first size is smaller than the second size.

4. The semiconductor device of claim 1, wherein the insulating film includes a low-dielectric-constant insulating film.

5. The semiconductor device of claim 1, wherein a distance between the plug and the first dummy interconnects is within about 13 times a diameter of the plug.

6. A semiconductor device, comprising:
   an interconnect provided in an interconnect area on a surface of an insulating film;
   a plug connected to a bottom surface of the interconnect in a first area within the interconnect area;
   first dummy interconnects provided in the first area within the interconnect area, the first dummy interconnects having a first pitch, a first size, and a first local pattern density, the first local pattern density being defined as a fractional area occupied by one of the first dummy interconnects within an area provided by the first pitch on a surface of the first area; and
   second dummy interconnects provided in a second area excluding the first area within the interconnect area, the second dummy interconnects having a second pitch, a second size, and a second local pattern density, the second local pattern density being defined as a fractional area occupied by one of the second dummy interconnect interconnects within an area provided by the second pitch on a surface of the second area, at least one of the second pitch, the second size, and the second local pattern density being different from the first pitch, the first size, and the first local pattern density;
   wherein the first local pattern density is greater than the second local pattern density.

7. The semiconductor device of claim 6, wherein the first pitch is smaller than the second pitch.

8. The semiconductor device of claim 7, wherein the first size is smaller than the second size.

9. The semiconductor device of claim 6, wherein the insulating film includes a low-dielectric-constant insulating film.

10. The semiconductor device of claim 6, wherein a distance between the plug and the first dummy interconnects is within about 13 times a diameter of the plug.

* * * * *